(12) United States Patent
Leng

(10) Patent No.: US 11,824,079 B2
(45) Date of Patent: Nov. 21, 2023

(54) THIN-FILM RESISTOR (TFR) HAVING A TFR ELEMENT PROVIDING A DIFFUSION BARRIER FOR UNDERLYING TFR HEADS

(71) Applicant: Microchip Technology Incorporated, Chandler, AZ (US)

(72) Inventor: Yaojian Leng, Portland, OR (US)

(73) Assignee: Microchip Technology Incorporated, Chandler, AZ (US)

( * ) Notice: Subject to any disclaimer, the term of this patent is extended or adjusted under 35 U.S.C. 154(b) by 285 days.

(21) Appl. No.: 17/233,285

(22) Filed: Apr. 16, 2021

(65) Prior Publication Data

US 2022/0271117 A1    Aug. 25, 2022

Related U.S. Application Data

(60) Provisional application No. 63/152,374, filed on Feb. 23, 2021.

(51) Int. Cl.
*H01C 7/00*    (2006.01)
*H01L 21/768*    (2006.01)
(Continued)

(52) U.S. Cl.
CPC ............. *H01L 28/24* (2013.01); *H01C 7/006* (2013.01); *H01L 21/76807* (2013.01); *H01L 23/53238* (2013.01)

(58) Field of Classification Search
CPC ..... H01L 28/24; H01L 28/20; H01L 23/5228; H01L 23/53238; H01L 27/0802;
(Continued)

(56) References Cited

U.S. PATENT DOCUMENTS 6,426,268 B1 * 7/2002 Huppert ................ H01L 27/016
257/E27.116
8,040,213 B2 * 10/2011 Ashikaga ............. H01C 17/065
338/314
(Continued)

OTHER PUBLICATIONS

International Search Report and Written Opinion, Application No. PCT/US2021/036326, 14 pages, dated Nov. 2, 2021.

*Primary Examiner* — Jaehwan Oh
*Assistant Examiner* — John M Parker
(74) *Attorney, Agent, or Firm* — SLAYDEN GRUBERT BEARD PLLC

(57) ABSTRACT

A thin-film resistor (TFR) module is formed in an integrated circuit device. The TFR module includes a pair of metal TFR heads (e.g., copper damascene trench structures), a TFR element formed directly on the metal TFR heads to define a conductive path between the pair of TFR heads through the TFR element, and TFR contacts connected to the TFR heads. The TFR heads may be formed in a metal interconnect layer, along with various interconnect elements of the integrated circuit device. The TFR element may be formed by depositing and patterning a TFR element/diffusion barrier layer over the TFR heads and interconnect elements formed in the metal interconnect layer. The TFR element may be formed from a material that also provides a barrier against metal diffusion (e.g., copper diffusion) from each metal TFR head and interconnect element. For example, the TFR element may be formed from tantalum nitride (TaN).

18 Claims, 15 Drawing Sheets

(51) Int. Cl.
*H01L 23/532* (2006.01)
*H01L 49/02* (2006.01)

(58) Field of Classification Search
CPC . H01L 27/016; H01L 27/76807; H01C 7/006; H01C 7/075
See application file for complete search history.

(56) References Cited

U.S. PATENT DOCUMENTS

| | | | |
|---|---|---|---|
| 2002/0197844 A1 | 12/2002 | Johnson et al. | 438/618 |
| 2010/0073122 A1* | 3/2010 | Le Neel | H01L 23/5228 338/25 |
| 2010/0136764 A1* | 6/2010 | Dirnecker | H01L 21/76838 257/E21.004 |
| 2010/0151651 A1* | 6/2010 | Beach | H01L 27/016 257/E21.004 |
| 2014/0184381 A1 | 7/2014 | Hao et al. | 338/306 |
| 2015/0162396 A1 | 6/2015 | Yagi et al. | 257/532 |
| 2019/0109186 A1* | 4/2019 | Leng | H01L 21/76804 |

* cited by examiner

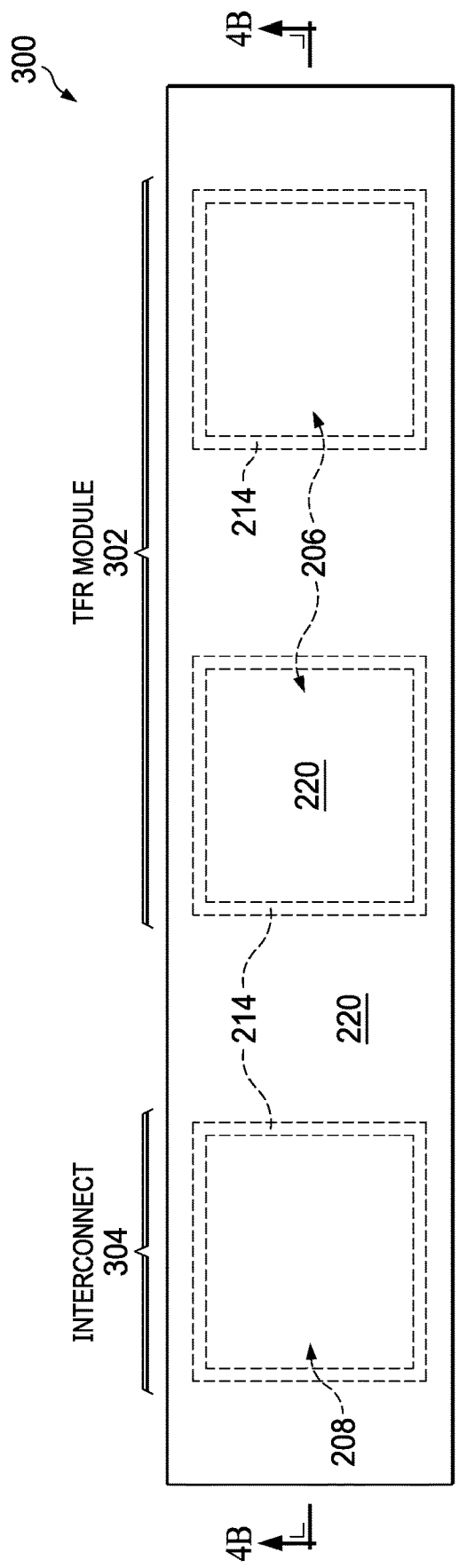
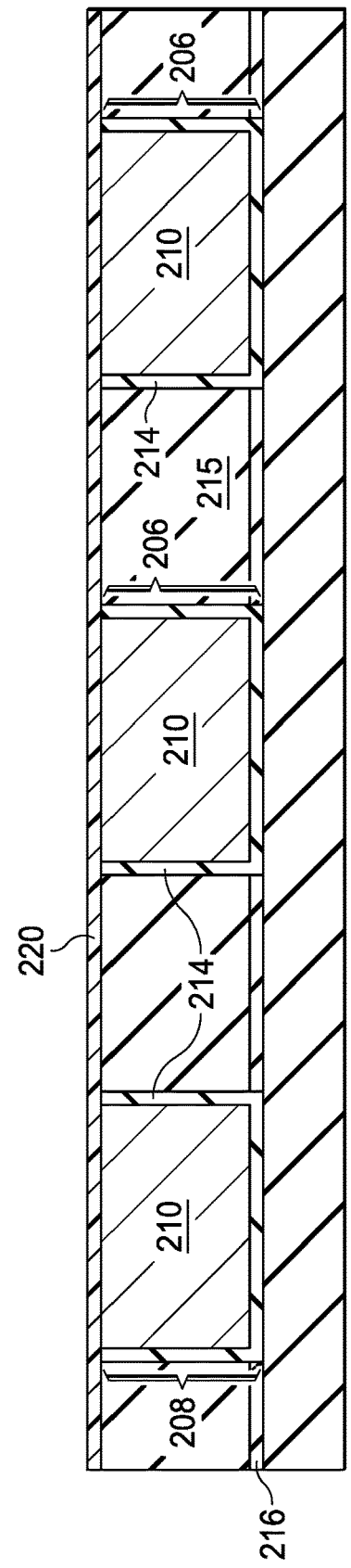
FIG. 4A
FIG. 4B

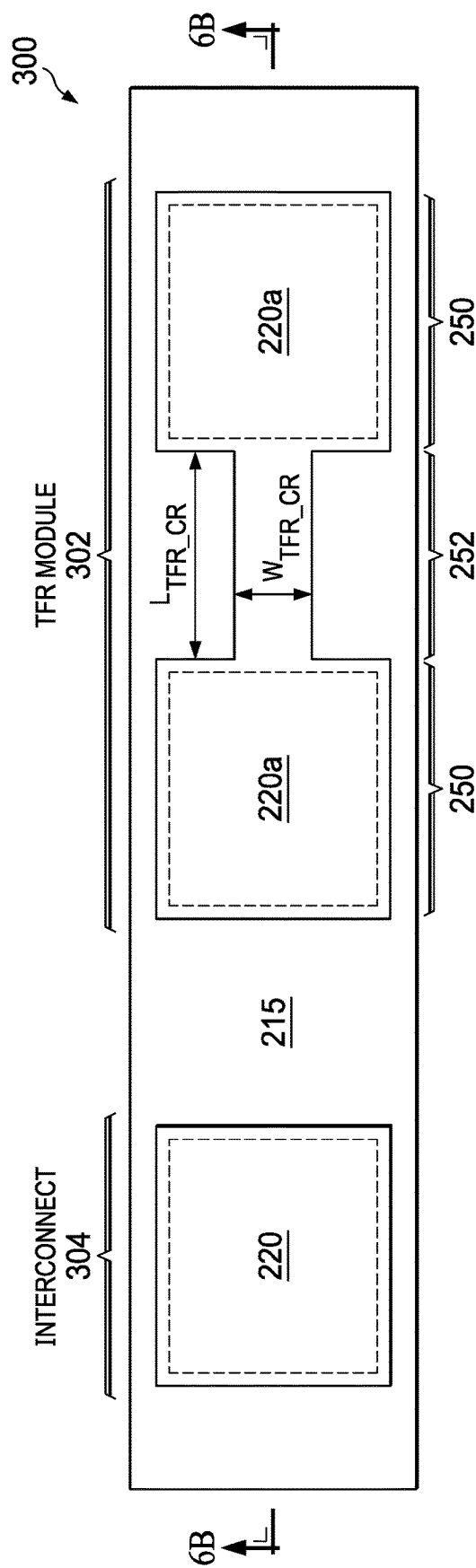
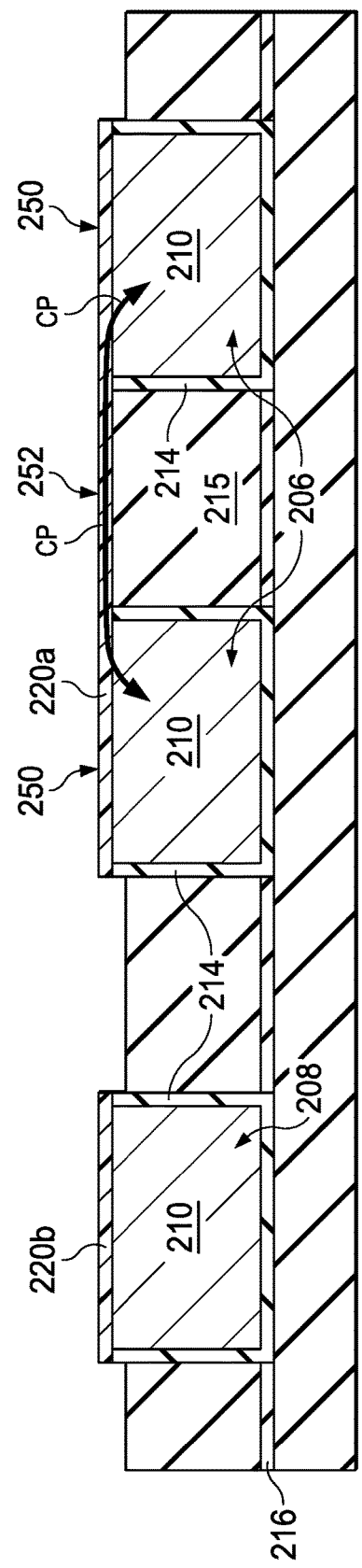
FIG. 6A
FIG. 6B

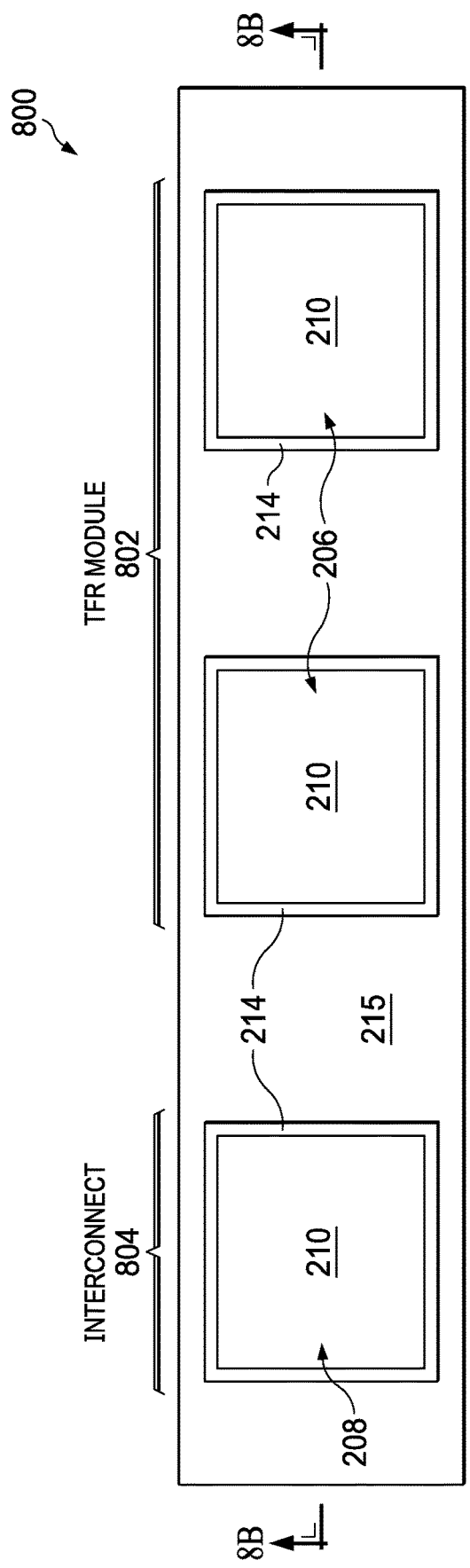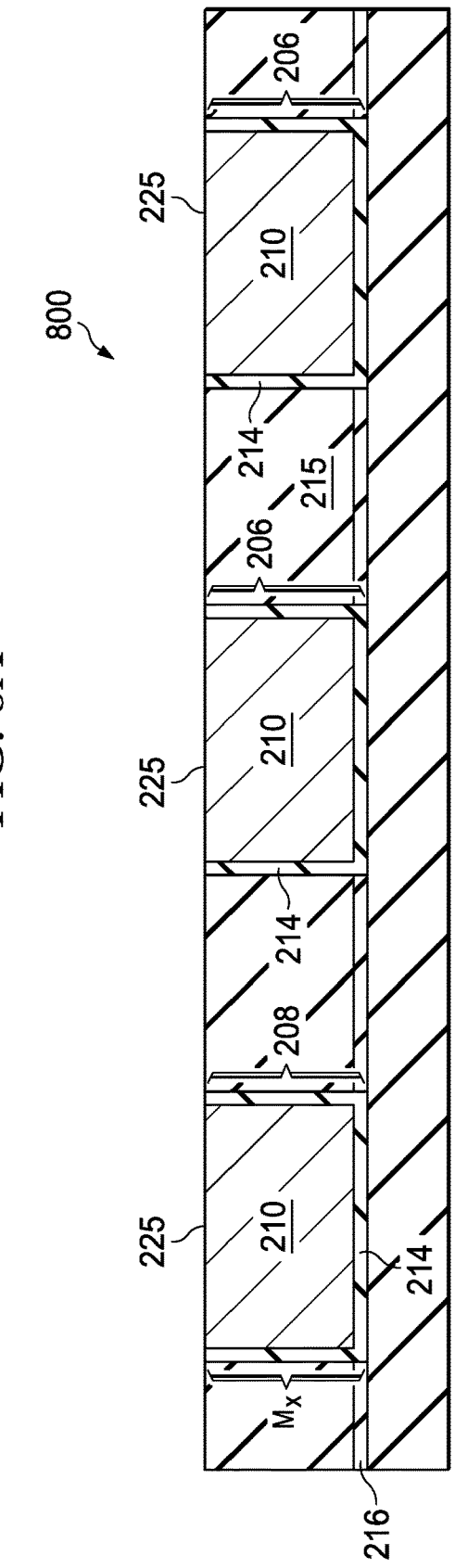
FIG. 8A
FIG. 8B

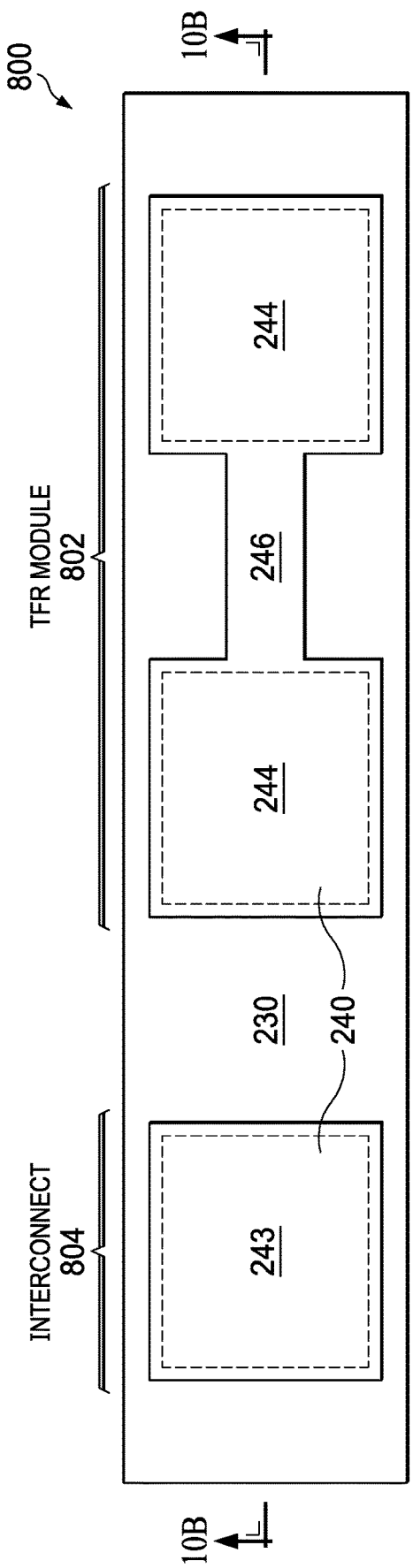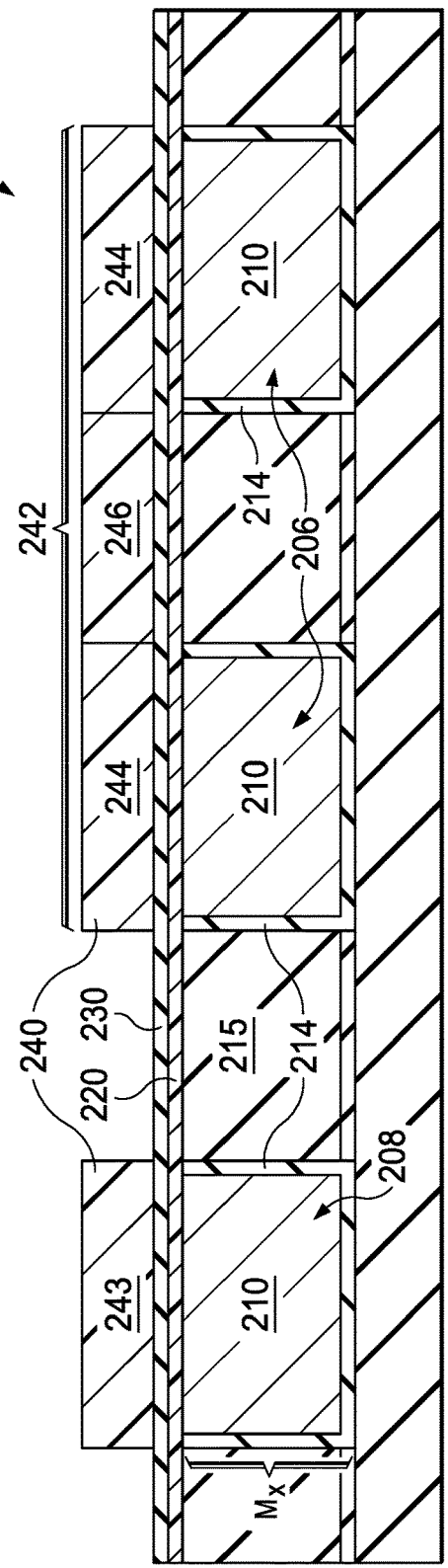
FIG. 10A
FIG. 10B

THIN-FILM RESISTOR (TFR) HAVING A TFR ELEMENT PROVIDING A DIFFUSION BARRIER FOR UNDERLYING TFR HEADS

RELATED APPLICATION

This application claims priority to commonly owned U.S. Provisional Patent Application No. 63/152,374 filed Feb. 23, 2021, the entire contents of which are hereby incorporated by reference for all purposes.

TECHNICAL FIELD

The present disclosure relates to thin-film resistors (TFRs) formed on integrated circuit (IC) devices, and more particularly to TFR modules having a TFR element that also acts as a diffusion barrier for underlying metal TFR heads, and methods for forming such TFR modules.

BACKGROUND

Semiconductor-based integrated circuit (IC) devices typically include patterned metal layers, referred to as interconnects, to connect various components of the IC devices, e.g., back end of line (BEOL) circuity elements. Copper (Cu) and aluminum (Al) are common interconnect materials. Copper is often preferred due to its lower resistivity and high electro-migration resistance. However, copper interconnect is typically difficult to manufacture with traditional photoresist masking and plasma etching techniques.

One known technique for forming copper interconnects in an IC device is known as additive patterning, sometimes called a damascene process, which refers to traditional metal inlaying techniques. A damascene process may include patterning a dielectric region, e.g., including silicon dioxide, fluorosilicate glass (FSG), or organo-silicate glass (OSG), to form open trenches where the copper (or other metal) is intended to be formed. A copper diffusion barrier layer (typically Tantalum (Ta), Tantalum Nitride (TaN), or a bi-layer of both) is deposited, followed by deposition of a copper seed layer, followed by a bulk copper fill, e.g., using an electro-chemical plating process. A chemical-mechanical planarization (CMP) process may then be used to remove any excessive copper and barrier layer material, and may thus be referred to as a copper CMP. The copper remaining in each trench functions as a conductor. A dielectric barrier layer, e.g., silicon nitride (SiN) or silicon carbide (SiC), is then typically deposited over the wafer to prevent copper diffusion (e.g., into neighboring silicon), thereby improving device reliability.

With more features being packed into individual semiconductor chips, there is an increased need to fit large numbers of passive components, such as resistors, into the circuits. Some resistors can be created through ion implantation and diffusion, such as poly resistors. However, such resistors typically have high variations in resistance value, and may also have resistance values that change drastically as a function of temperature. A developing technique for constructing integrated resistors, called Thin-Film Resistors (TFRs), typically improves integrated resistor performance. TFRs are often formed from silicon-chromium (SiCr), silicon-silicon carbide-chromium (SiCCr), TaN, nickel-chromium (NiCr), aluminum-doped nickel-chromium (AlNiCr), or titanium-nickel-chromium (TiNiCr), for example.

FIG. 1 shows a cross-sectional view of two example TFRs 10A and 10B implemented using conventional techniques. The fabrication of a conventional TFR 10A or 10B typically requires three added mask layers, with reference to a background fabrication process for the relevant IC device. In particular, a first added mask layer may be used to create TFR heads 12A and 12B, a second added mask layer may be used to create a TFR element 14, and a third added mask layer may be used to create TFR vias 16A and 16B. As shown, the TFR element 14 of TFR 10A is formed across the top of the TFR heads 12A and 12B, while the TFR element 14 of TFR 10B is formed across the bottom of the TFR heads 12A and 12B, but each design typically uses three added mask layers.

Some implementations of TFRs 10A and 10B are formed in copper interconnect, for example by forming TFR heads 12A and 12B as Cu damascene structures. However, using copper interconnect for TFR modules has been particularly challenging. For example, copper TFR heads 12A and 12B are typically susceptible to copper corrosion during TFR manufacturing and copper diffusion during and/or after TFR manufacturing, which may form deep-level traps and substantially degrade transistor performance in the relevant device. A dielectric barrier layer, such as silicon nitride, or silicon carbide, is often used to seal exposed copper interconnect surfaces, e.g., after a copper CMP, but such barrier layer prevents direct electrical connection to the copper, and is thus not suitable for protecting copper TFR heads.

There is a need for improved TFRs for integrated circuits, and methods of construction. For example, there is a need for TFR modules integrated in copper interconnect that avoid or reduce the copper corrosion and/or copper diffusion associated with conventional designs, to thereby improve device performance. Further, there is a need or advantage (e.g., cost and time advantage) to reduce the number of mask layers needed to construct integrated TFRs e.g., as compared with conventional TFRs 10A and 10B discussed above. There is also a need in some applications for such TFR module that provide a sheet resistance $R_s$ of about 1 k$\Omega$/square, for example, and a temperature coefficient of resistance (TCR) close to zero, for example in the range of $-100$ ppm/$^\circ$ C. to $+100$ ppm/$^\circ$ C., or closer to zero, which may enable new integrated circuit designs, particularly designs including analog components in copper interconnect structures.

SUMMARY

Embodiments of the present disclosure provide TFRs that may be integrated in IC devices in a modular manner, thus referred to herein as "TFR modules." For example, some embodiments provide TFR modules formed in damascene interconnect structures of IC devices, and methods for manufacturing such TFR modules. The TFR modules can be formed at any level of interconnect (e.g., at any metal layer) in the IC device structure.

Some embodiments provide thin-film resistor (TFR) modules formed in integrated circuit devices. A TFR module may include a pair of metal TFR heads (e.g., copper damascene trench structures), a TFR element formed directly on the metal TFR heads, and TFR contacts connected to the metal TFR heads. The metal TFR heads may be formed in a metal interconnect layer, along with various interconnect elements of the respective integrated circuit device. The TFR element may be formed by depositing and patterning a TFR element/diffusion barrier layer over the metal TFR heads (to define a TFR element that also protects against metal diffusion from the TFR heads) and over the interconnect elements (to protect against metal diffusion from the interconnect elements). Thus, the TFR element/diffusion barrier layer may comprise a material that both (a) acts as a TFR element connecting the TFR heads and (b) act as a diffusion barrier for the underlying metal TFR heads and interconnect elements. For example, the TFR element/diffusion barrier layer may be formed from tantalum nitride (TaN), which may be particularly suitable for such functions. Alternatively, the TFR element/diffusion barrier layer may be formed from SiCr, Silicon-Carbon-Chromium (SiCCr), Titanium Oxynitride ($TiN_xO_y$), Titanium Nitride (TiN), Titanium-Tungsten (TiW), Titanium-Tungsten-Nitride ($TiW_2N$), or Titanium-Zinc-Nitride (TiZrN).

In some embodiments, a supplemental diffusion barrier, e.g., comprising a layer of SiN, SiC or other dielectric material, may be formed over the TFR element/diffusion barrier layer, to supplement the diffusion barrier functionality of the TFR element/diffusion barrier layer.

One aspect provides a method of forming a TFR module in an integrated circuit structure. A pair of metal TFR heads are formed spaced apart from each other in the integrated circuit structure, a TFR element is formed directly on the pair of metal TFR heads to define a conductive path between the pair of metal TFR heads through the TFR element, and TFR contacts are connected to each of the pair of metal TFR heads. The TFR element comprises a material that provides a barrier against metal diffusion from the metal TFR heads.

In some embodiments, the TFR element comprises TaN. In other embodiments, the TFR element comprises SiCr, SiCCr, $TiN_xO_y$, TiN, TiW, $TiW_2N$, or TiZrN.

In some embodiments, the TFR element (a) has a sheet resistance in the range of 200 Ω/square to 2 kΩ/square, and (b) has a temperature coefficient of resistance (TCR) close to zero, for example in the range of −100 ppm/° C. to +100 ppm/° C.

In some embodiments, the pair of metal TFR heads are formed in a common metal interconnect layer.

In some embodiments, the TFR contacts are formed in a metal layer above the metal TFR heads and connected to the metal TFR heads by vias.

In some embodiments, the pair of metal TFR heads comprise copper TFR heads. For example, the metal TFR heads may be formed using a copper damascene process.

In some embodiments, the TFR element fully covers a top surface of each metal TFR head.

In some embodiments, a dielectric barrier layer is formed on the TFR element, e.g., to supplement the diffusion barrier functionality of the TFR element. In some embodiments, the dielectric barrier layer formed on the TFR element comprises SiC or SiN.

Another aspect provides a method of forming an integrated circuit structure. A plurality of metal structures are formed in a metal layer and define a pair of metal TFR heads and a metal interconnect element. A TFR element/diffusion barrier layer comprising a material that provides a barrier against metal diffusion, and exhibits resistance appropriate for use as a TFR element, is deposited on the plurality of metal structures. The TFR element/diffusion barrier layer may be patterned to define (a) a TFR element in contact with the pair of metal TFR heads to define a conductive path between the metal TFR heads, and (b) an interconnect diffusion barrier region on the metal interconnect element. TFR contacts may then be formed in contact with the metal TFR heads.

In some embodiments, the TFR element/diffusion barrier layer comprises TaN. In other embodiments, the TFR element/diffusion barrier layer comprises SiCr, SiCCr, $TiN_xO_y$, TiN, TiW, $TiW_2N$, or TiZrN.

In some embodiments, forming the plurality of metal structures comprises forming a plurality of copper trench elements in a copper interconnect layer. For example, the copper trench elements may be formed using a copper damascene process.

In some embodiments, a dielectric barrier layer, e.g., comprising SiC or SiN, is formed on the TFR element/diffusion barrier layer before patterning the TFR element/diffusion barrier layer, and the dielectric barrier layer is patterned and etched together with the TFR element/diffusion barrier layer. The dielectric barrier layer may supplement the diffusion barrier functionality of the TFR element/diffusion barrier layer. In other embodiments, a dielectric barrier layer, e.g., comprising SiC or SiN, is formed on the TFR element/diffusion barrier layer after patterning and etching the TFR element/diffusion barrier layer.

Another aspect provides an integrated circuit structure including (a) a pair of metal TFR heads formed in a common metal interconnect layer, (b) a patterned TFR element/diffusion barrier layer comprising a material that provides a barrier against metal diffusion and exhibits resistance appropriate for use as a TFR element, formed on the pair of metal TFR heads, and (c) a TFR contact connected to each metal TFR head. The patterned TFR element/diffusion barrier layer includes a TFR element in contact with the pair of metal TFR heads, the TFR element (a) defining a conductive path between the metal TFR heads through the TFR element to define a TFR module, and (b) defining a diffusion barrier against metal diffusion from the pair of metal TFR heads.

In some embodiments, a metal interconnect element is also formed in the common metal interconnect layer and spaced apart from the pair of metal TFR heads, and the patterned TFR element/diffusion barrier layer further includes an interconnect diffusion barrier region on the metal interconnect element to provide a diffusion barrier for the metal interconnect element.

In some embodiments, the patterned TFR element/diffusion barrier layer comprises TaN. In other embodiments, the patterned TFR element/diffusion barrier layer comprises SiCr, SiCCr, $TiN_xO_y$, TiN, TiW, $TiW_2N$, or TiZrN.

In some embodiments, the integrated circuit structure also includes a dielectric barrier layer formed on the patterned TFR element/diffusion barrier layer, e.g., to supplement the diffusion barrier functionality of the TFR element/diffusion barrier layer.

BRIEF DESCRIPTION OF THE DRAWINGS

Example aspects of the present disclosure are described below in conjunction with the figures, in which:

FIGS. 3A-7 show an example process for forming an integrated circuit structure including a TFR module with a TFR element that provides a diffusion barrier for underlying metal TFR heads, according to one example embodiment;

FIGS. 8A-12 show an example process for forming an integrated circuit structure including a TFR module with a TFR element that provides a diffusion barrier for underlying metal TFR heads, along with a supplemental dielectric barrier layer, according to one example embodiment.

Figure 1:
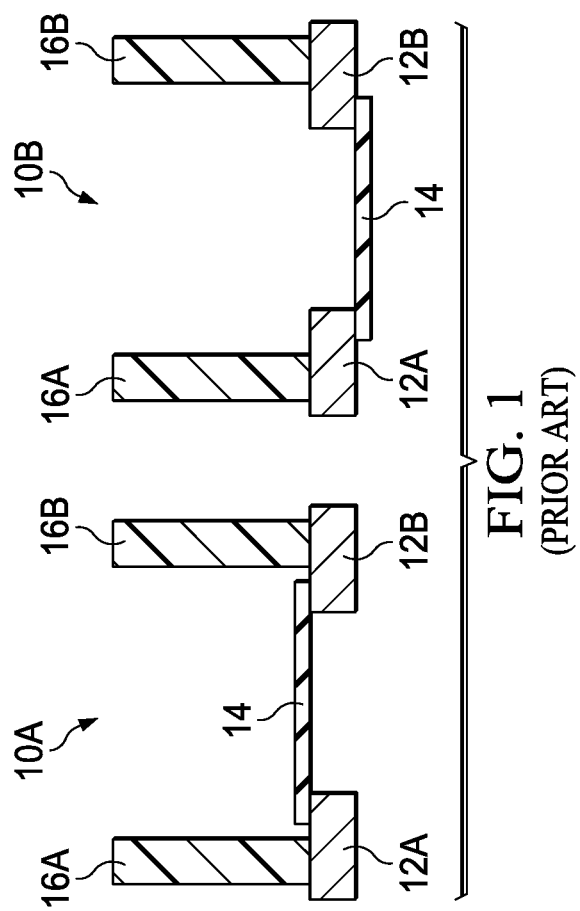
FIG. 1 shows a cross-sectional view of two example TFRs implemented using conventional techniques.

It should be understood that the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Embodiments of the present disclosure provide thin-film resistor (TFR) modules formed in integrated circuit devices, and methods for forming such TFR modules. In some embodiments, a TFR module may include a pair of TFR heads (e.g., copper trench structures), a TFR element formed directly on the TFR heads to define a conductive path between the pair of TFR heads through the TFR element, and TFR contacts connected to the TFR heads. The TFR heads may be formed in a metal interconnect layer, e.g., copper interconnect, along with various interconnect elements of the integrated circuit device. The TFR element may be formed by depositing and patterning a TFR element/diffusion barrier layer over the TFR heads and interconnect elements formed in the metal interconnect layer. The TFR element/diffusion barrier layer may comprise a material that exhibits resistance appropriate for use as a TFR element and provides a barrier against metal diffusion (e.g., copper diffusion) from each TFR head and interconnect element. For example, the TFR element/diffusion barrier layer may comprise tantalum nitride (TaN). Alternatively, the TFR element/diffusion barrier layer may comprise SiCr, SiCCr, $TiN_xO_y$, TiN, TiW, $TiW_2N$, or TiZrN.

Statements and references herein regarding a particular structure providing a barrier against metal diffusion from another structure (e.g., in the context of the TFR element/diffusion barrier layer, or a TFR element or interconnect diffusion barrier region formed from the TFR element/diffusion barrier layer, providing a barrier against metal diffusion from metal TFR heads or interconnect elements) means the particular structure provides at least a partial barrier against metal diffusion from the other structure. For example, a structure providing a barrier against metal diffusion may provide functional reliability for the relevant device (e.g., TFR or device including the TFR) over a 10 year period at normal device operating temperatures (−40° C. to 125° C.).

As discussed below, in some implementations, the TFR element/diffusion barrier layer provides a sufficient barrier against metal diffusion from underlying metal TFR heads and interconnect elements, according to relevant design standards and specifications for the particular implementation, such that a supplemental diffusion barrier may be omitted from the relevant structure/process. In other implementations, a supplemental diffusion barrier (e.g., dielectric barrier layer 230 discussed below) may be provided to supplement the diffusion barrier functionality provided by the TFR element/diffusion barrier layer, e.g., in view of relevant design standards and specifications for the particular implementation.

Figure 2:
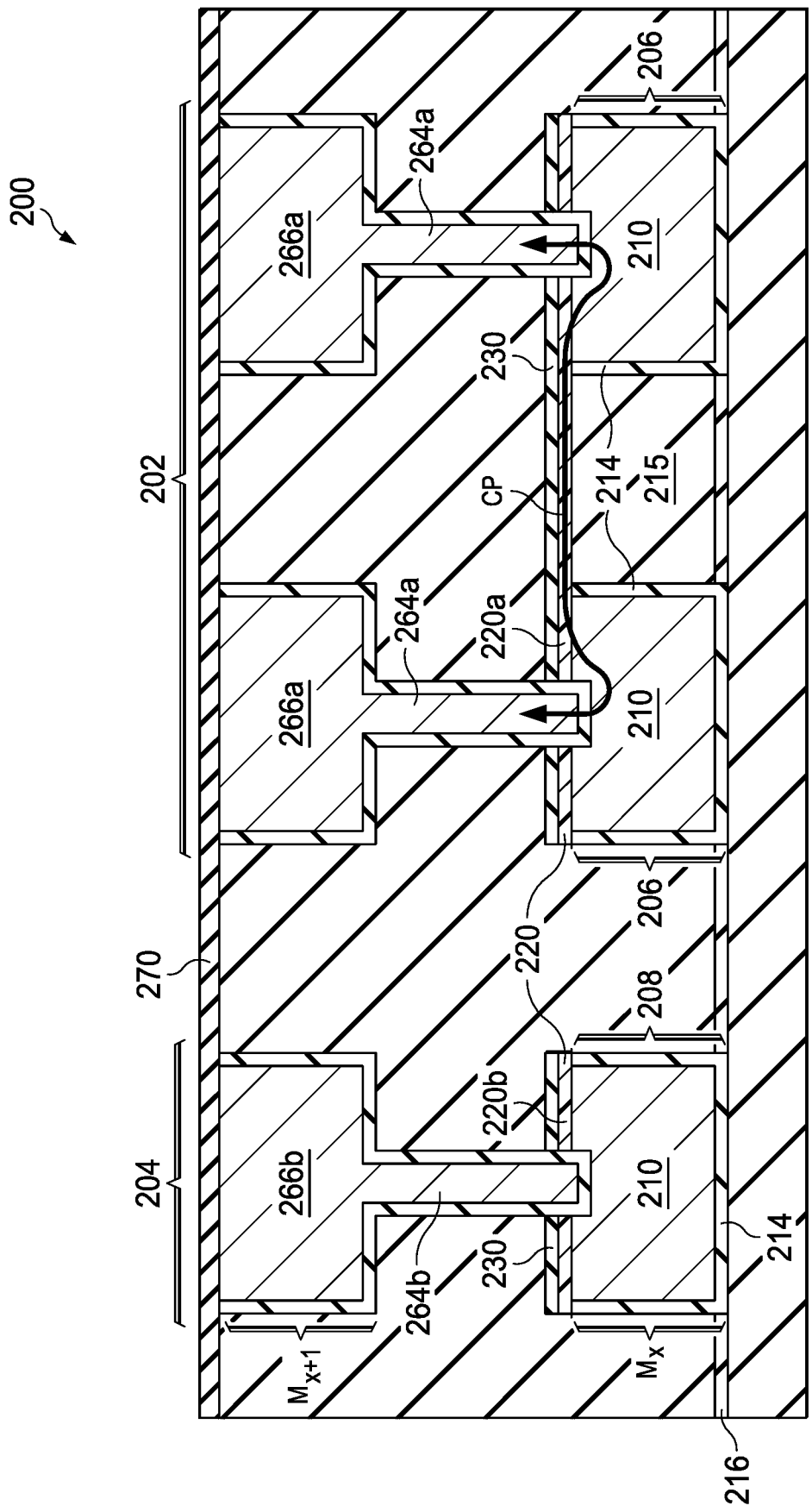
FIG. 2 illustrates an integrated circuit structure including a TFR module with a TFR element that provides a diffusion barrier for underlying metal TFR heads, according to one example embodiment of the present disclosure.

FIG. 2 illustrates an example IC structure 200 including a TFR module 202 along with a nearby example interconnect structure 204, formed according to one embodiments of the present disclosure. As shown, the TFR module 202 includes a TFR element 220a connecting a pair of TFR heads 206 with each other. Each TFR head 206 is contacted by a respective TFR contact via 264a and TFR contact 266a. The interconnect structure 204 includes a lower interconnect element 208 and an upper interconnect element 266b connected by an interconnect via 264b. In some embodiments, IC structure 200 may include any number of additional interconnect structures formed in the same material layers as TFR module 202 and the example interconnect structure 204, which may be structurally similar to or different from the example interconnect structure 204. In other embodiments, TFR module 202 may be formed without interconnect structures formed in the same material layers; in other words, interconnect structure 204 may be optional or omitted from IC structure 200.

Each TFR head 206 and lower interconnect element 208 may comprise a metal structure 210 formed in a metal interconnect layer $M_x$, wherein the subscript "x" refers the level of interconnect metal in the IC structure, for example x=2 refers to a metal-2 layer, whereas TFR contacts 266a and upper interconnect element 266b may comprise metal elements formed in the next formed metal interconnect layer $M_{x+1}$. In the illustrated embodiment, TFR contacts 266a and TFR contact vias 264a, and upper interconnect element 266b and interconnect via 264b, are formed as Cu dual damascene structures. As shown, a dielectric barrier layer 270 may be formed over metal layer $M_{x+1}$.

Metal interconnect layers $M_x$ and $M_{x+1}$ may represent any interconnect layers in an IC structure; thus, TFR module 202 may be formed at any depth in the example IC structure 200.

Each metal structure 210 may be formed over a barrier layer 214 (e.g., a Ta/TaN bilayer) deposited in a respective trench formed in a dielectric region 215. In some embodiments, metal structures 210 may be formed by a Cu damascene process, in which trench openings are etched in the dielectric region 215 down to an etch stop layer 216, e.g., a silicon nitride etch stop layer. Material forming barrier layer 214 (e.g., Ta/TaN bilayer) is deposited over the structure and down into the trenches, followed by copper deposition over the dielectric region 215 and extending down into the trench openings and onto the barrier layer 214. The Cu damascene process may be completed with a chemical mechanical polishing (CMP) process to remove unwanted copper at the top of the structure.

In addition to conductively connecting the pair of TFR heads 206 with each other, the TFR element 220a acts as a barrier against metal diffusion from TFR heads 206 (e.g., copper diffusion from copper TFR heads 206). In some embodiments, the TFR element 220a is formed by (a) depositing a TFR element/diffusion barrier layer 220 over the TFR heads 206 and lower interconnect element 208, and (b) patterning the TFR element/diffusion barrier layer 220 to define (i) the TFR element 220a extending across the tops of the TFR heads 206 (and also acting as a metal diffusion barrier for the TFR heads 206) and (ii) an interconnect diffusion barrier region 220b on top of the lower interconnect element 208.

Thus, the TFR element/diffusion barrier layer 220—which forms TFR element 220a and interconnect diffusion barrier region 220b comprises material(s) suitable for both (a) acting as an electrical TFR element (also referred to as a "TFR film") connected between the TFR heads 206 and (b) acting as a diffusion barrier for the underlying metal structures 210 (including TFR heads 206 and lower interconnect element 208), either alone or in combination with a supplemental dielectric barrier layer 230 (discussed below). For example, in some embodiments, the TFR element/diffusion barrier layer 220 comprises TaN, which provides an effective TFR element, having a tunable TCR (e.g., to provide a near zero TCR), while also acting as a metal diffusion barrier. In some embodiments, the TFR element/diffusion barrier layer 220 may have a thickness in the range of 50 Å-500 Å, or about 200 Å.

For example, a TFR element 220a formed from TaN with a thickness of 100 Å (e.g., by forming and patterning a TFR element/diffusion barrier layer 220 comprising TaN) may have a sheet resistance $R_s$ of about 1 kΩ/square. In some embodiments, where an anneal or other TCR tuning process is performed to bring the TCR of the TaN TFR element 220a closer to zero (e.g., providing a target $R_s$ value and target TCR value), the resulting composition and/or thickness may reduce the diffusion barrier effectiveness of the TFR element 220a. However, even when tuned for TFR performance, the TaN TFR element 220a still provides significant diffusion barrier functionality, which may be reinforced by a supplemental dielectric barrier 230, e.g., comprising SiN or SiC.

In other embodiments, the TFR element/diffusion barrier layer 220 (and thus, TFR element 220a formed therefrom) may comprise SiCr, SiCCr, $TiN_xO_y$, TiN, TiW, $TiW_2N$, or TiZrN.

In some embodiments, a supplemental dielectric barrier layer 230 (e.g., comprising silicon nitride or silicon oxide) may be formed over the TFR element/diffusion barrier layer 220, thus covering the TFR element 220a and interconnect diffusion barrier region 220b. The supplemental dielectric barrier layer 230 may be optional, e.g., depending on (a) the effectiveness of the TFR element/diffusion barrier layer 220 as a diffusion barrier for the underlying metal structures 210, which may be influenced, for example, by treatments (e.g., annealing) to improve the TCR characteristics of the TFR element/diffusion barrier layer 220, and/or (b) etch stop requirements for building the next level of interconnect structure, as defined by the relevant design specification, and/or other relevant considerations.

FIGS. 3A-7 discussed below show an example embodiment in which the TFR element/diffusion barrier layer 220 acts alone as a diffusion barrier for the top side of each underlying metal structures 210, without the supplemental dielectric barrier layer 230, e.g., in view of the considerations discussed above. This may provide an advantage, as the supplemental dielectric barrier layer 230 may have a relatively high dielectric constant that may increase interconnect RC delay and thus reduce the relevant device performance (e.g., speed). For example, dielectric barrier layer 230 may be formed from SiN having a dielectric constant of about 7, or SiC having a dielectric constant in the range of about 4.3 to 5.5, both of which are substantially higher than low-k dielectrics having a typical dielectric constant typically of less than 3.6. In contrast, FIGS. 8A-12 discussed below show an example embodiment including the supplemental dielectric barrier layer 230 (e.g., comprising SiN or SiC) formed over the TFR element/diffusion barrier layer 220, and selectively etched between the metal structures 210 to reduce the resultant increased interconnect RC delay and resulting reduction in device performance (e.g., speed). Finally, FIGS. 13A-15 discussed below show an example embodiment including the supplemental dielectric barrier layer 230 (e.g., SiN or SiC) formed over the TFR element/diffusion barrier layer 220 and left intact (e.g., without being selectively etched), for example to simplify the manufacturing process.

Although metal layers $M_x$ and $M_{x+1}$ may comprise copper as discussed above, in other embodiments metal layer $M_x$ and/or $M_{x+1}$ (and thus TFR heads 206, lower interconnect element 208, TFR contacts 266a, and/or upper interconnect element 266b) may be formed from other metal(s), for example aluminum (Al), iridium (Ir), rhodium (Rh), ruthenium (Ru), or cobalt (Co). The various barrier layers, for example TFR element/diffusion barrier layer 220, the optional dielectric barrier layer 230, and/or dielectric barrier layer 270 may be adjusted accordingly, i.e. the constituent elements thereof, based on the selected interconnect metal.

Figure 3A:
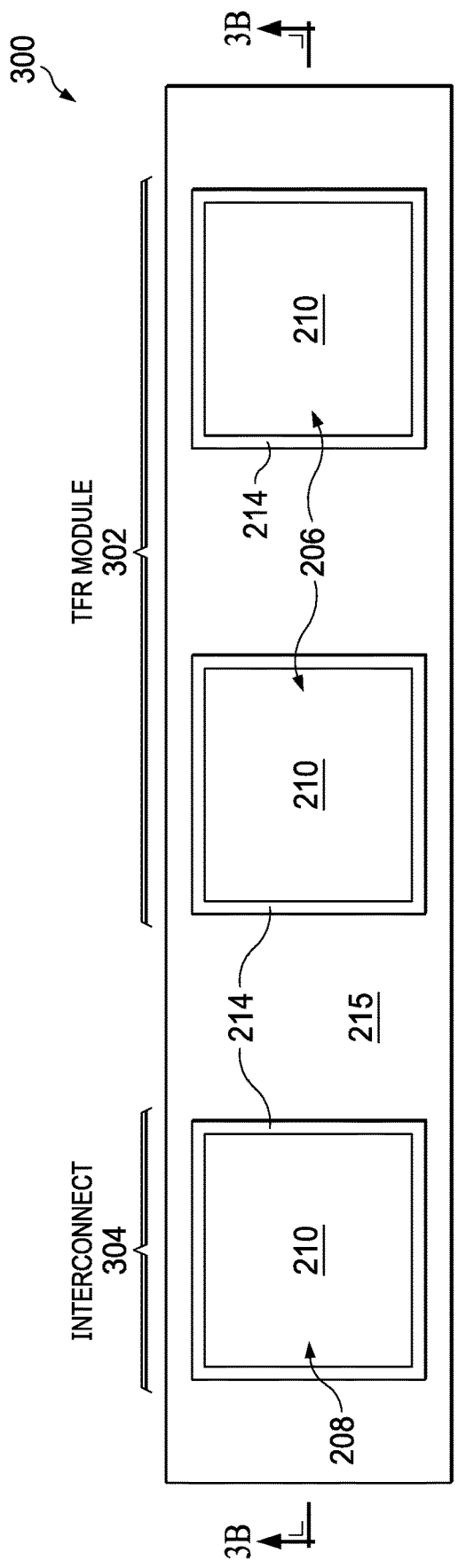
Figure 7:
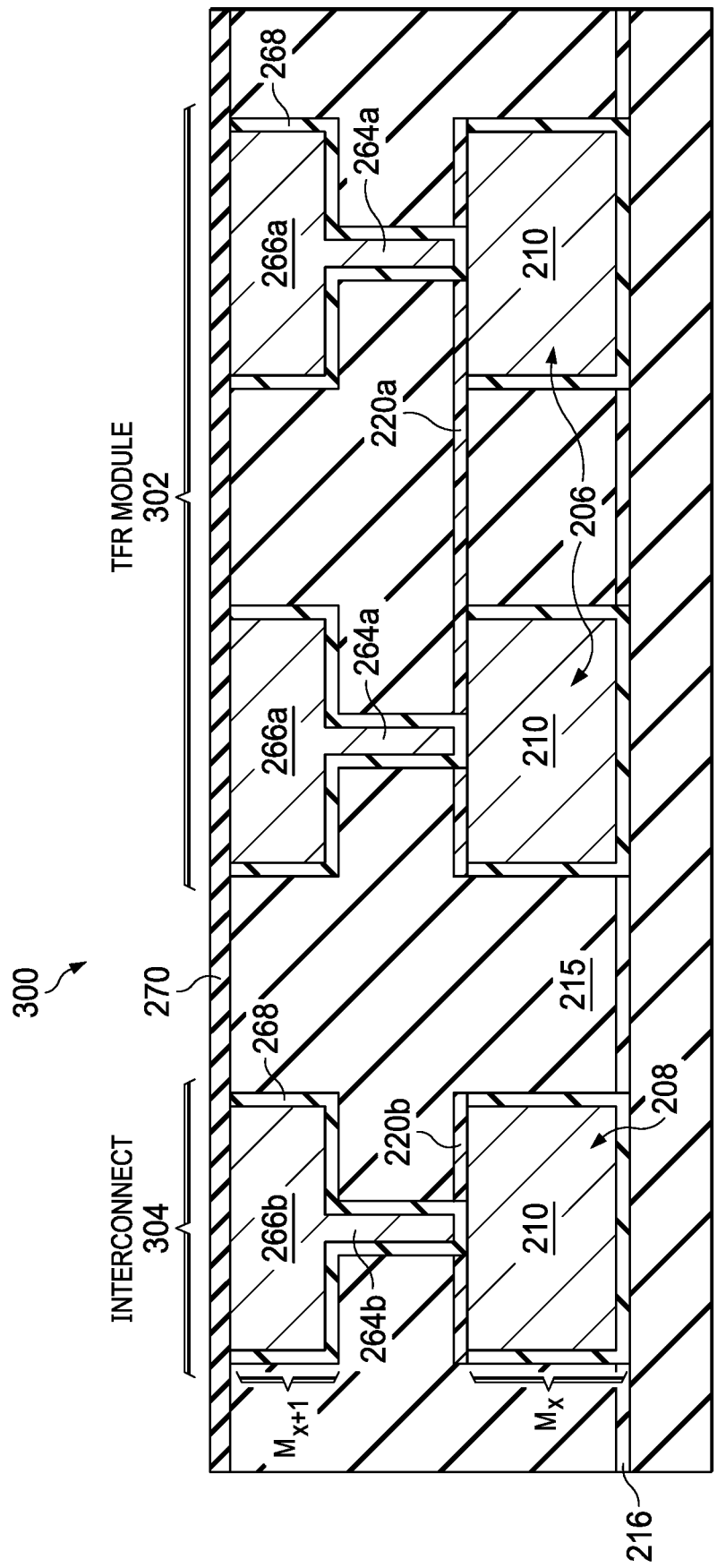

FIGS. 3A-7 show an example process for forming a TFR module 302 along with a nearby interconnect element 304 in an example IC structure 300, according to one embodiment of the present disclosure. TFR module 302 and interconnect structure 304 formed according to the process shown in FIGS. 3A-7 may correspond with TFR module 202 and interconnect structure 204, respectively, shown in FIG. 2. Each pair of figures sharing the same figure number, namely FIGS. 3A and 3B, FIGS. 4A and 4B, FIGS. 5A and 5B, and FIGS. 6A and 6B, shows a similar top view and a cross-sectional side view, respectively, of the example IC structure 300 being constructed, in which the cross-sectional side view is taken through a cut line indicated in the top view. For example, FIG. 3B shows a cross-sectional side view taken through line 3B-3B shown in the top view FIG. 3A, FIG. 4B shows a cross-sectional side view taken through line 4B-4B shown in the top view FIG. 4A, etc. FIG. 7 shows a cross-sectional side view of the completed example IC structure 300, comprising TFR module 302 and interconnect 304.

As discussed above regarding IC structure 200, IC structure 300 may include any number of additional interconnect structures formed in the same material layers as TFR module 302 and the example interconnect structure 304, which may be structurally similar to or different from the example interconnect structure 304. In other embodiments, TFR module 302 may be formed without interconnect structures formed in the same material layers; in other words, interconnect structure 304 may be optional or omitted from IC structure 300.

Figure 3B:
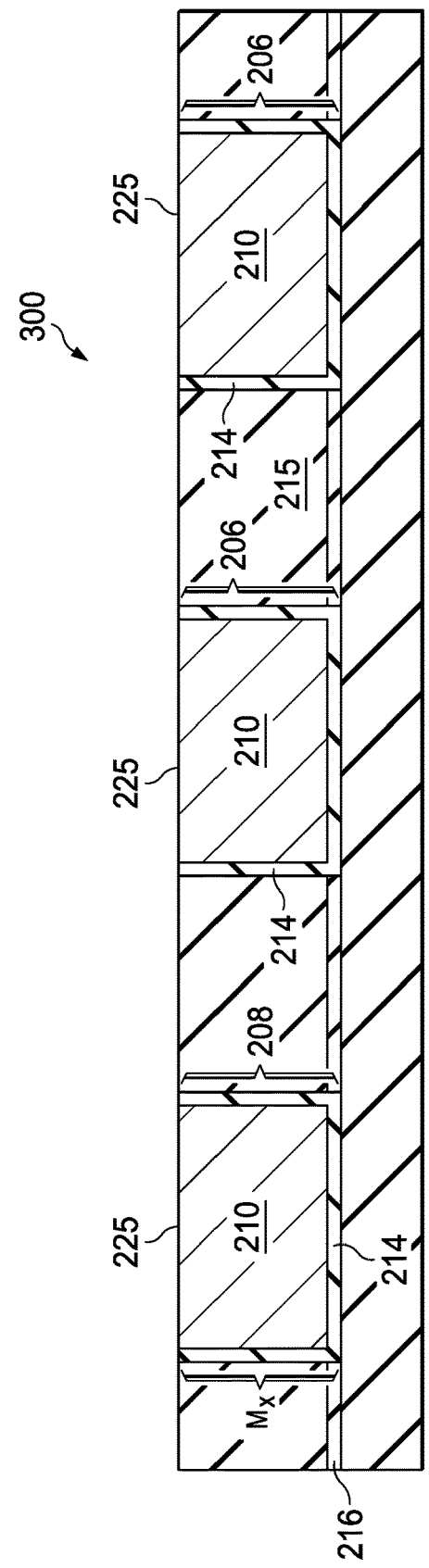

As shown in FIGS. 3A and 3B, the IC structure 300 may include metal structures 210 formed in metal layer $M_x$ in a dielectric region 215. Metal structures 210 may define (a) a pair of TFR heads 206 for the TFR module 302 being constructed and (b) a lower interconnect element 208 for the interconnect structure 304. In some embodiments metal structures 210 are formed from Cu.

Each metal structure 210 may be formed over a barrier layer 214 (e.g., a Ta/TaN bilayer) deposited in a respective trench opening. In one embodiment, the metal structures 210 may be trench elements formed by a Cu damascene process in which Cu is deposited over dielectric region 215 and extends down into trench openings formed in dielectric region 215, followed by a CMP process to remove unwanted Cu at the top of the structure. Dielectric region 215 may include one or more dielectric materials, e.g., at least one of silicon oxide, fluorosilicate glass (FSG), organosilicate glass (OSG), porous OSG, or other low-k dielectric material, e.g., having a dielectric constant less than 3.6.

After the CMP process, an exposed top surface 225 of each metal structure 210 is typically susceptible to oxidation, for example from the oxygen in the air, moisture in the air, or water residue left from a post CMP clean. Exposure to light may further accelerate such oxidation or corrosion process. Such corrosion can result in yield loss and reliability failure of the resulting IC device. Thus, it may be beneficial to protect the upper surface of each metal structure 210 soon after the CMP to reduce this corrosion risk.

Next, as shown in FIGS. 4A and 4B, a TFR element/diffusion barrier layer 220 is deposited over the structure, for example covering the full semiconductor wafer. The TFR element/diffusion barrier layer 220 may be deposited directly onto the TFR heads 206 and lower interconnect element 208. The TFR element/diffusion barrier layer 220 may be deposited by physical vapor deposition (PVD) or other suitable deposition technique. Generally, the TFR element/diffusion barrier layer 220 may comprise a material, or a combination of materials, that (a) act as a TFR element connecting the TFR heads 206 (e.g., having a sheet resistance in the range of 200 Ω/square to 2 kΩ/square, or in the range of 500 Ω/square to 1 kΩ/square) and (b) act as a diffusion barrier for the underlying metal structures 210. For example, in some embodiments, the TFR element/diffusion barrier layer 220 may comprise TaN, which may be particularly effective as both a TFR element and a metal diffusion barrier. In other embodiments, TFR element/diffusion barrier layer 220 may comprise SiCr, SiCCr, $TiN_xO_y$, TiN, TiW, $TiW_2N$, or TiZrN. Example characteristics of the TFR element/diffusion barrier layer 220 are discussed in further detail below with reference to FIGS. 6A and 6B.

In some embodiments, a temperature coefficient of resistance (TCR) of the TFR element/diffusion barrier layer 220 may be modified or "tuned" to a value closer to zero, for example to a value in the range of −100 ppm/° C. to +100 ppm/° C., in the range of −50 ppm/° C. to +50 ppm/° C., or in the range of −10 ppm/° C. to +10 ppm/° C., to thereby reduce the temperature-sensitivity of the performance of TFR module 202. For example, in some embodiments, the TFR element/diffusion barrier layer 220 may be annealed (thereby tuning the TCR value of layer 220 closer to zero) by depositing layer 220 using a controlled deposition process at an elevated temperature, for example above 250° C., above 300° C., or above 350° C., for example in the range of 250° C. to 400° C., in the range of 300° C. to 400° C., or in the range of 350° C. to 400° C.

In other embodiments, the TCR value of the TFR element/diffusion barrier layer 220 may be adjusted closer to zero by performing a TFR anneal at any other step in the manufacturing process, e.g., before or after the patterning and etching of the TFR element/diffusion barrier layer 220 to form TFR element 220a.

Figure 5A:
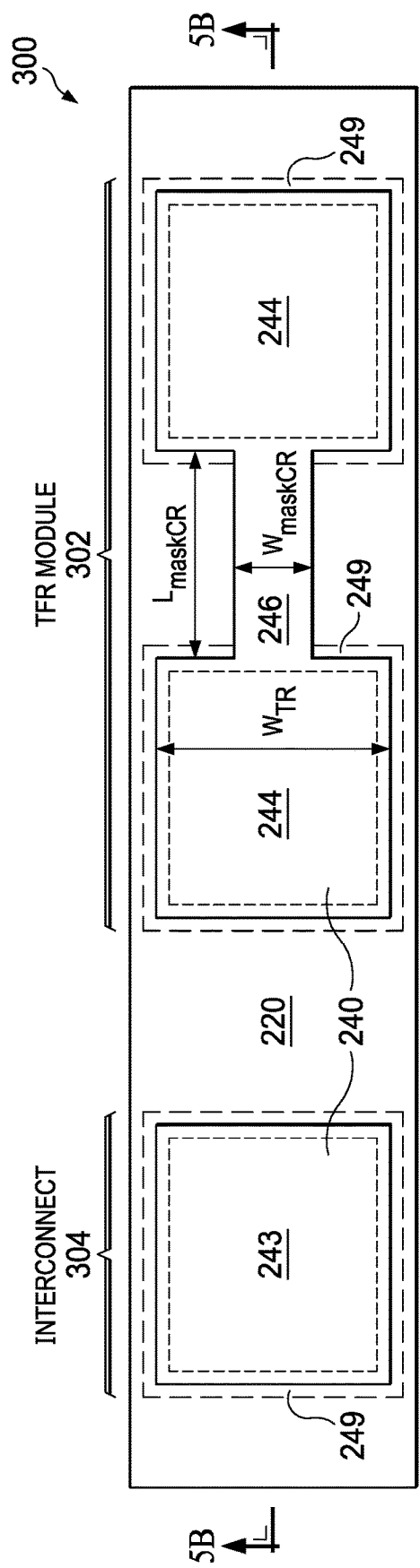
Figure 5B:
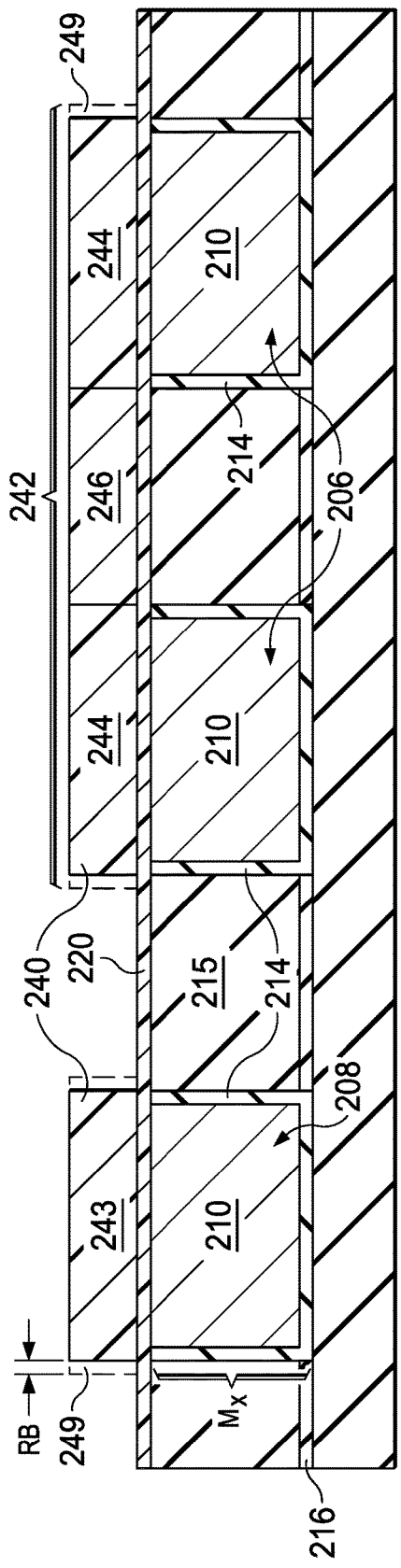

Next, as shown in FIGS. 5A and 5B, a photoresist mask (photomask) 240 is formed and patterned over the TFR element/diffusion barrier layer 220. The patterned photomask 240 may include (a) a TFR patterning region 242 including a respective TFR head region 244 over each TFR head 206 and a connecting region 246 connecting the two TFR head regions 244, and (b) an interconnect patterning region 243 covering the lower interconnect element 208. A length $L_{maskCR}$ and width $W_{maskCR}$ of the connecting region 246, which defines corresponding dimensions of the resulting post-etch TFR element 220a as shown in FIGS. 6A-6B discussed below, may be selected to provide desired performance characteristics of the resulting TFR module 302.

In the illustrated embodiment, the patterned photomask 240 fully covers the patterned copper layer $M_x$, or in other words, the patterned photomask 240 covers the full area (from the top view shown in FIG. 5A) of all metal structures 210 in layer $M_x$ on the wafer, including TFR heads 206 and lower interconnect element 208. Patterning the photomask 240 to fully cover the metal structures 210 in metal layer $M_x$ may provide various advantages, as compared with patterning only an area associated with the TFR module 302. For example, in a photolithography process in which the TFR pattern density is low (e.g., about 1%), the required photo exposure is typically very high, which may cause the lens to overheat, leading to unwanted process variation. By patterning a much larger percentage of the wafer area (i.e., to cover all of the metal structures 210 in $M_x$ layer), the required photo exposure may be substantially reduced, thus avoid potential lens overheating.

In addition, patterning the larger percentage of the wafer area may substantially reduce the subsequent plasma etch burden (by reducing the area to etch). In addition, the risk of plasma etch penetrating through the TFR element/diffusion barrier layer 220 at the top of each metal structure 210 may be reduced or eliminated. Moreover, by patterning the full copper layer $M_x$, the photomask may be generated in a straightforward manner, e.g., by first reverse tuning the mask used to form the trench layer $M_x$ (e.g., by switching from glass to chrome or from chrome to glass), then performing a logic "OR" of the reverse tuned mask with the TFR module pattern.

In some embodiments, a reticle bias (e.g., a positive bias for over-sizing, or negative bias for under sizing) can be added when reverse tuning the mask used to form the trench layer $M_x$. As shown in FIGS. 5A-5B, in some embodiments a slight positive reticle bias, indicated at RB, may be used to provide a photo alignment margin 249 around each underlying metal element 210. If the etched TFR element/diffusion barrier layer 220 experiences metal shorting, the reticle bias RB can be reduced, or a negative bias may even be used, for example where a zero bias on the reticle results in a positive bias on the wafer due to etch bias.

Next, as shown in FIGS. 6A and 6B, an etch may be performed to remove portions of the TFR element/diffusion barrier layer 220 in areas unprotected by the patterned photomask 240. In some embodiments, a plasma etch, or alternatively a wet etch, may be performed. A resist strip and clean process may be performed after the etch.

The resulting portions of TFR element/diffusion barrier layer 220 define (a) a TFR element 220a over the TFR heads 206 and over a portion of dielectric region 215 therebetween, and (b) a interconnect diffusion barrier region 220b over the lower interconnect element 208. The TFR element 220a includes (a) a TFR head region 250 covering the full area of each TFR head 206 (corresponding with TFR head regions 244 of patterned photomask 240 discussed above), and (b) a connecting region 252 that connects the two TFR head regions 250. As noted above, a length $L_{TFR\_CR}$ and width $W_{TFR\_CR}$ of the TFR element connecting region 252 may be defined by selecting the length $L_{maskCR}$ and width $W_{maskCR}$ of the photomask connecting region 246 to provide desired performance characteristics of the resulting TFR module 302.

TFR element 220a formed on the pair of TFR heads 206 as disclosed above thereby defines a conductive path between the two Cu TFR head elements 206, as indicated by the double-headed arrow CP. In addition, the TFR element 220a acts as a barrier against metal diffusion from TFR heads 206 (e.g., copper diffusion from copper TFR heads 206). Similarly, interconnect diffusion barrier region 220b, also formed from the TFR element/diffusion barrier layer 220, acts as a barrier against metal diffusion from the lower interconnect element 208.

Thus, in some embodiments, the TFR element/diffusion barrier layer 220, exhibits the following properties, either before or after (or both before and after) being patterned to form TFR element 220a and interconnect diffusion barrier region 220b as discussed above:

(a) acts as an effective TFR element (TFR film) for the TFR module 202, for example having a sheet resistance in the range of 200 Ω/square to 2 kΩ/square, or in the range of 500 Ω/square to 1500 Ω/square, or about 1 kΩ/square;

(b) has a temperature coefficient of resistance (TCR) close to 0, for example in the range of −100 ppm/° C. to +100 ppm/° C., or in the range of −50 ppm/° C. to +50 ppm/° C., or in the range of −10 ppm/° C. to +10 ppm/° C. (for example after a high-temperature deposition or other annealing of layer 220, as discussed above) to reduce the magnitude of the TCR of layer 220; and (c) acts as a diffusion barrier for the underlying metal structures 210 (TFR heads 206 and lower interconnect element 208).

In some embodiments, the TFR element/diffusion barrier layer 220 may comprise TaN which may be particularly effective as both a TFR element and a metal diffusion barrier. For example, the TFR element/diffusion barrier layer 220 may comprise a TaN layer having a thickness in the range of 50 Å-1000 Å, in the range of 50 Å-300 Å, or in the range of 75 Å-150 Å, which may provide a sheet resistance $R_s$ in the range of 200 Ω/square to 2 kΩ/square, or in the range of 500 Ω/square to 1500 Ω/square, or about 1 kΩ/square, and a temperature coefficient of resistance (TCR) in the range of −100 ppm/° C. to +100 ppm/° C., in the range of −50 ppm/° C. to +50 ppm/° C., or in the range of −10 ppm/° C. to +10 ppm/° C.

In other embodiments, TFR element/diffusion barrier layer 220 may comprise SiCr, SiCCr, $TiN_xO_y$, TiN, TiW, $TiW_2N$, or TiZrN.

Although metal layers $M_x$ and $M_{x+1}$ may comprise copper as discussed above, in other embodiments metal layer $M_x$ and/or metal layer $M_{x+1}$ (and thus TFR heads 206, lower interconnect element 208, and/or upper interconnect element 266b) may be formed from other metal(s), for example iridium (Ir), rhodium (Rh), ruthenium (Ru), or cobalt (Co).

Next, as shown in the cross-sectional side view of FIG. 7, interconnect formation may continue, to thereby contact TFR heads 206 and lower interconnect element 208. For example, each TFR head 206 may be contacted by a respective interconnect via 264a connected to a respective metal structure 266a formed in a metal layer $M_{x+1}$, and lower interconnect element 208 may be contacted by an interconnect via 264b and upper interconnect element 266b formed in a metal layer $M_{x+1}$. In the illustrated embodiment, TFR contacts 266a and TFR contact vias 264a, and upper interconnect element 266b and interconnect via 264b, comprise dual damascene Cu structures, e.g., formed by depositing a barrier layer 268 (e.g., a Ta/TaN bilayer), copper seed, and followed by copper plating and a copper CMP process, in respective dual damascene trenches and vias. Finally, a dielectric barrier layer 270, e.g., comprising silicon nitride (SiN) or silicon carbide (SiC), without limitation, may be formed over metal layer $M_{x+1}$.

As discussed above, in some embodiments a supplemental dielectric barrier layer (e.g., SiN or SiC) may be formed over the TFR element/diffusion barrier layer 220, e.g., to provide additional protection against diffusion from the underlying metal structures 210, e.g., copper diffusion in embodiments in which metal structures 210 comprise Cu trench structures. In some embodiments, the supplemental dielectric barrier layer may be deposited on the TFR element/diffusion barrier layer 220 prior to etching the TFR element/diffusion barrier layer 220, such that the supplemental dielectric barrier layer is etched along with the underlying TFR element/diffusion barrier layer 220. In other embodiments, the supplemental dielectric barrier layer may be deposited after etching the TFR element/diffusion barrier layer 220 (to define the TFR element 220a and interconnect diffusion barrier region 220b as discussed above) and left intact as a continuous layer extending across the wafer.

FIGS. 8A-12 show an example process for forming a TFR module 802 along with a nearby interconnect structure 804 in an example IC structure 800, wherein a supplemental dielectric barrier layer 230 is deposited and etched over the TFR element/diffusion barrier layer 220, according to one embodiment of the present disclosure. IC structure 800 generally corresponds with IC structure 300 shown in FIGS. 3A through 7, but with the addition of the supplemental dielectric barrier layer 230.

Each pair of figures sharing the same figure number, namely FIGS. 8A and 8B, FIGS. 9A and 9B, FIGS. 10A and 10B, and FIGS. 11A and 11B, shows a similar top view and a cross-sectional side view, respectively, of the example IC structure 800 being constructed, in which the cross-sectional side view is taken through a cut line indicated in the top view. For example, FIG. 8B shows a cross-sectional side view taken through line 8B-8B shown in the top view FIG. 8A, etc. FIG. 12 shows a cross-sectional side view of the completed example IC structure 800, including TFR module 802 and interconnect 804.

First, FIGS. 8A and 8B show IC structure 800 corresponding with IC structure 300 shown in FIGS. 3A and 3B, discussed above. Thus, IC structure 800 include metal structures 210 formed in metal layer $M_x$ in a dielectric region 215. Metal structures 210 may define (a) a pair of TFR heads 206 for the TFR module 802 being constructed and (b) a lower interconnect element 208 for the interconnect structure 804. In one example embodiment metal structures 210 are formed of Cu. Each metal structure 210 may be formed over a barrier layer 214 (e.g., a Ta/TaN bilayer) deposited in a respective trench opening.

Figure 9A:
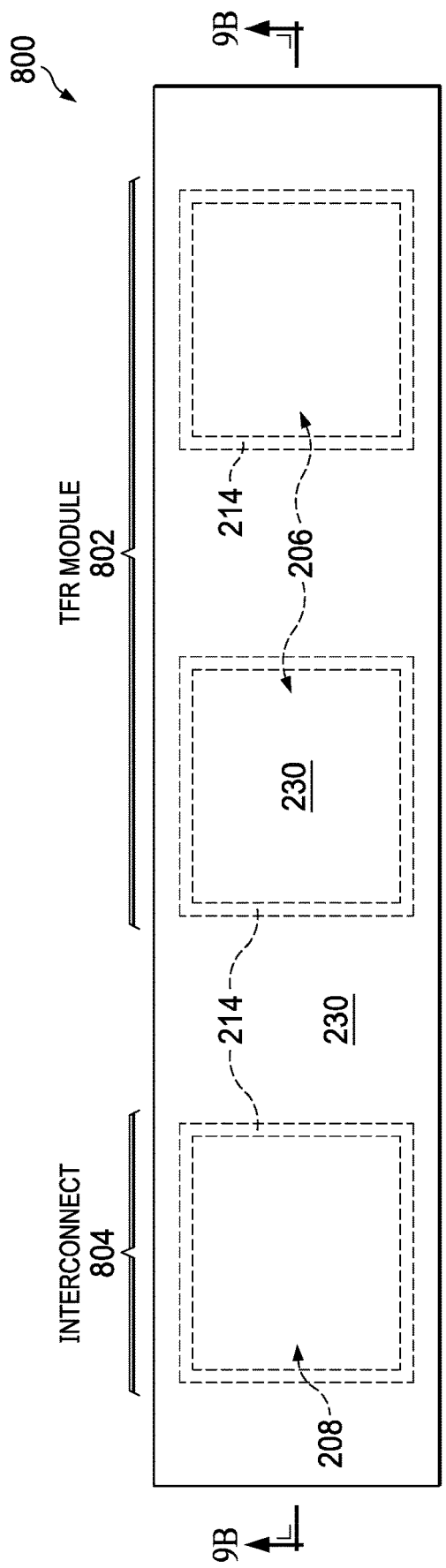
Figure 9B:
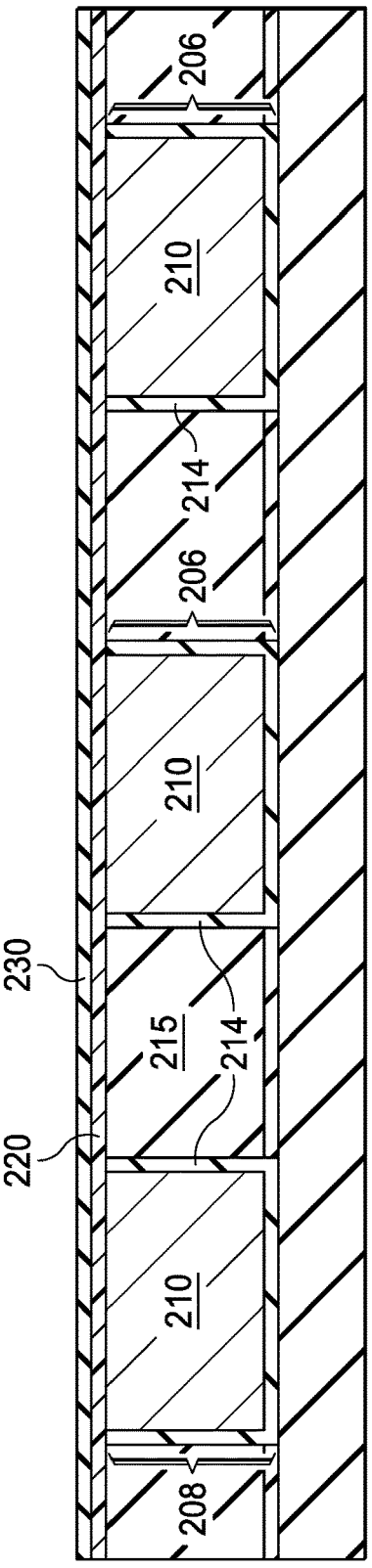

Next, as shown in FIGS. 9A and 9B, a TFR element/diffusion barrier layer 220 is deposited over the structure, followed by deposition of a supplemental dielectric barrier layer 230, for example covering the full semiconductor wafer. The TFR element/diffusion barrier layer 220 may be deposited directly onto the TFR heads 206 and lower interconnect element 208. The TFR element/diffusion barrier layer 220 may comprise TaN, SiCr, SiCCr, $TiN_xO_y$, TiN, TiW, $TiW_2N$, or TiZrN, or other suitable material, and may be deposited by physical vapor deposition (PVD) or other suitable technique. The supplemental dielectric barrier layer 230 may comprise SiN or SiC, or other dielectric material that provides additional protection against metal diffusion from underlying metal elements 210. The supplemental dielectric barrier layer 230 may be deposited by Plasma Enhanced Chemical Vapor Deposition (PECVD) or other suitable technique. In some embodiments, the supplemental dielectric barrier layer 230 may have a thickness in the range of 250 Å-1000 Å, or about 500 Å.

Next, as shown in FIGS. 10A and 10B, a photoresist mask (photomask) 240 is formed and patterned over the dielectric barrier layer 230 and underlying TFR element/diffusion barrier layer 220. As discussed above regarding FIGS. 5A and 5B, the patterned photomask 240 may include (a) a TFR patterning region 242 including (i) a respective TFR head region 244 over each TFR head 206 and (ii) a narrowed connecting region 246 connecting the two TFR head regions 244, and (b) an interconnect patterning region 243 covering the lower interconnect element 208.

In this embodiment, the patterned photomask 240 fully covers the patterned copper layer $M_x$, or in other words, the patterned photomask 240 covers the full area (from the top view shown in FIG. 10A) of all metal structures 210 in layer $M_x$ on the wafer, including TFR heads 206 and lower interconnect element 208. Patterning the photomask 240 to fully cover the metal structures 210 in metal layer $M_x$ may provide various advantages, as discussed above regarding FIGS. 5A and 5B. Further, as discussed above, the photomask may be formed with a positive or negative reticle bias, according to relevant process specification. Due to the provision of supplemental dielectric barrier layer 230, a negative reticle bias may be easily achieved without concern over copper diffusion.

Figure 11A:
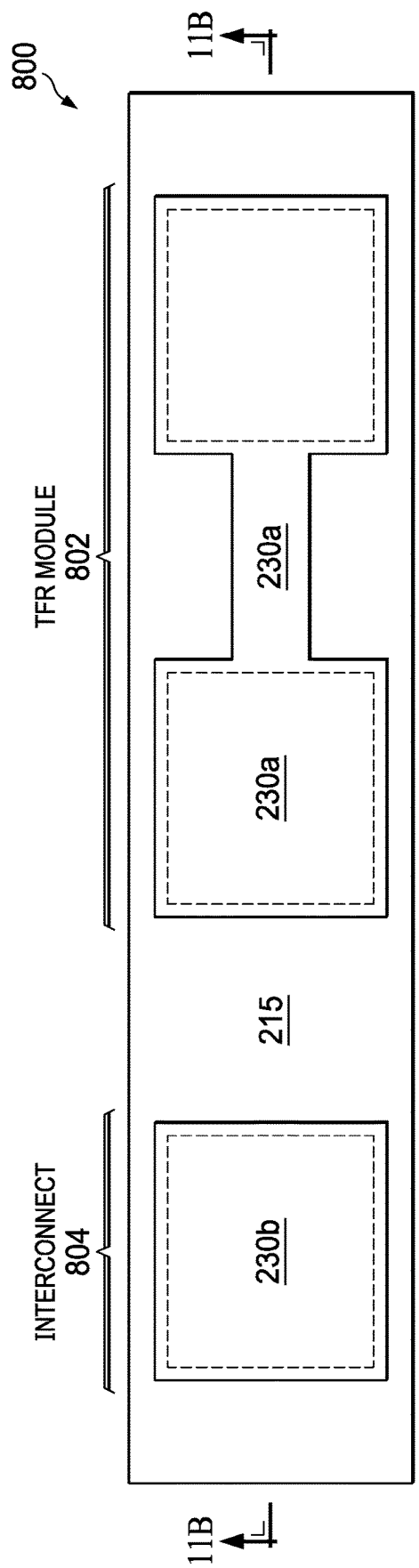
Figure 11B:
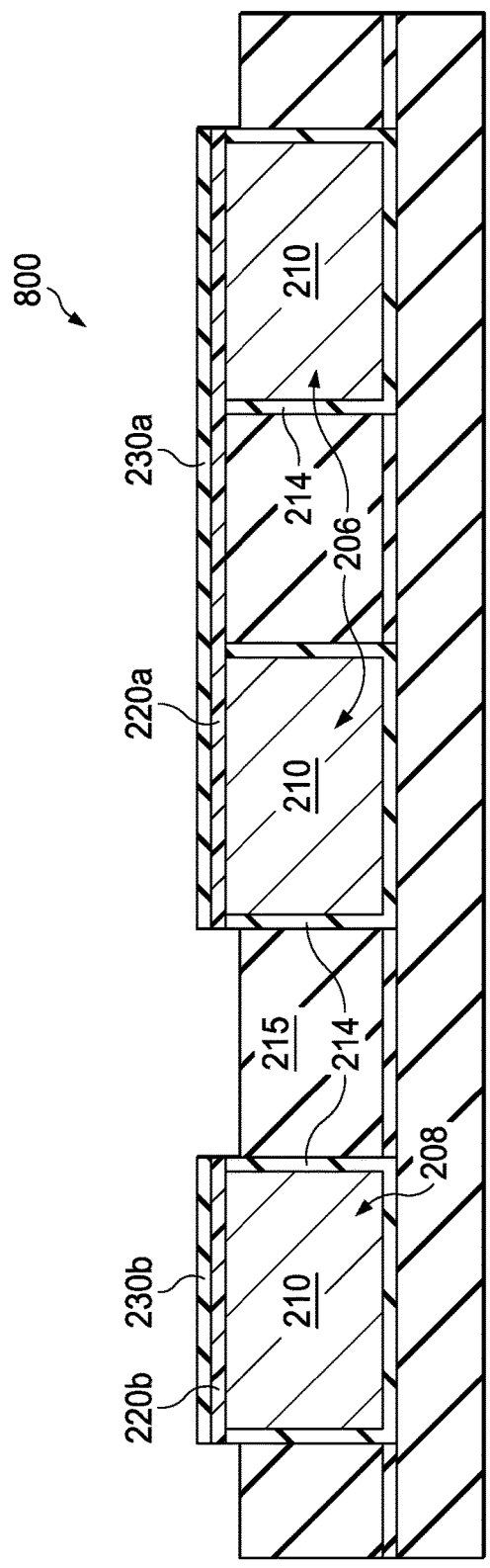
Figure 12:
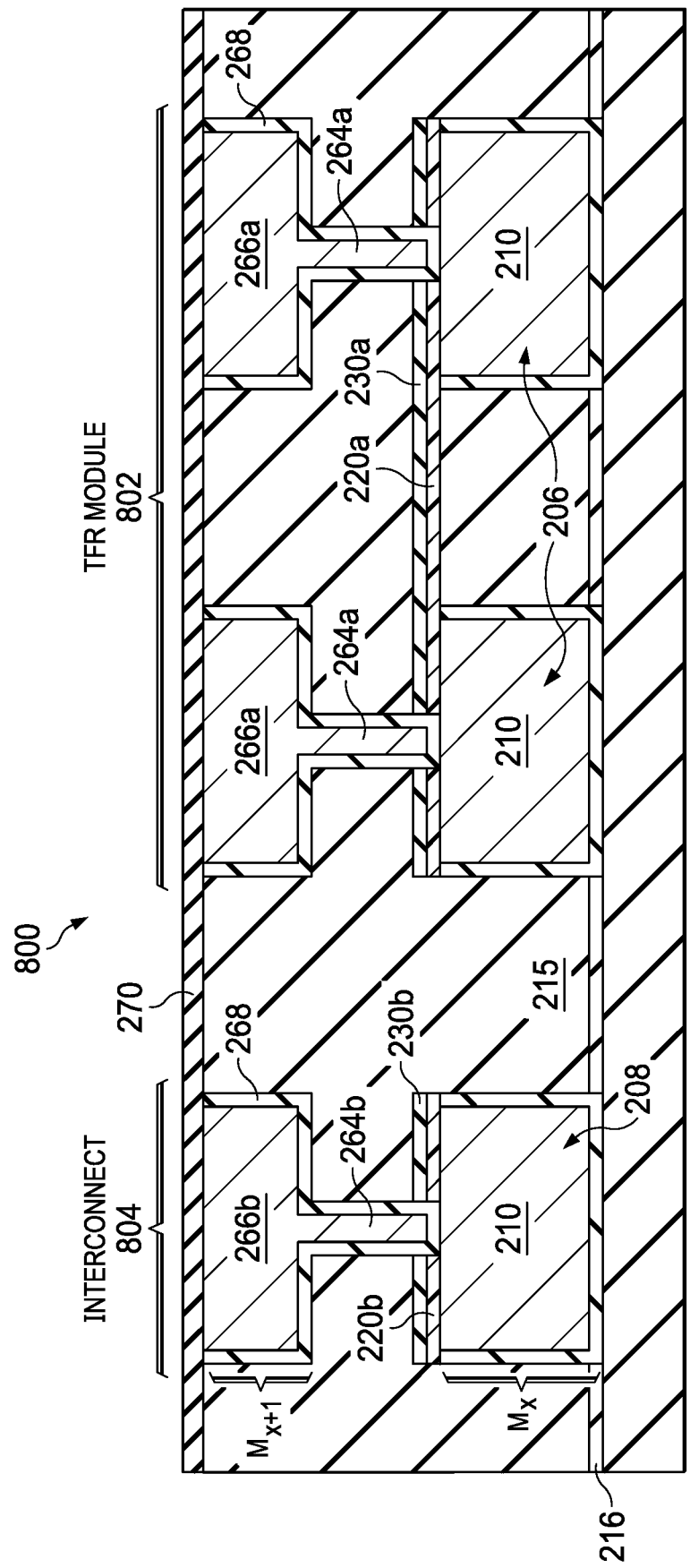

Next, as shown in FIGS. 11A and 11B, an etch may be performed to remove portions of the dielectric barrier layer 230 and underlying TFR element/diffusion barrier layer 220 in areas unprotected by the patterned photomask 240. In some embodiments, a plasma etch, or alternatively a wet etch, may be performed. A resist strip and clean process may be performed after the etch.

The resulting portions of the dielectric barrier layer 230 and TFR element/diffusion barrier layer 220 define (a) a TFR element 220a with an overlying TFR dielectric cap 230a over the TFR heads 206 and over a portion of dielectric region 215 therebetween, and (b) an interconnect diffusion barrier region 220b with an overlying interconnect dielectric cap 230b over the lower interconnect element 208. The TFR element 220a conductively connects the TFR heads 206, and acts as a diffusion barrier, in cooperation with overlying TFR dielectric cap 230a, against metal diffusion from TFR heads 206. Similarly, interconnect diffusion barrier region 220b, in cooperation with overlying interconnect dielectric cap 230b, acts as a barrier against metal diffusion from the lower interconnect element 208. As indicated, the TFR dielectric cap 230a and interconnect dielectric cap 230b supplement the diffusion blocking functionality provided by the respective TFR element 220a and interconnect diffusion barrier region 220b formed from the TFR element/diffusion barrier layer 220 as discussed above.

Next, as shown in the cross-sectional side view of FIG. 12, interconnect formation may continue, to thereby contact the TFR heads 206 and lower interconnect element 208. For example, each TFR head 206 may be contacted by a respective interconnect via 264a connected to a respective metal structure 266a formed in a metal layer $M_{x+1}$, and lower interconnect element 208 may be contacted by an interconnect via 264b and upper interconnect element 266b formed in a metal layer $M_{x+1}$. In the illustrated embodiment, TFR contacts 266a and TFR contact vias 264a, and upper interconnect element 266b and interconnect via 264b, comprise Cu dual damascene structures, e.g., formed by depositing a barrier layer 268 (e.g., a Ta/TaN bilayer), copper seed, and followed by copper plating, in a dual damascene trench, followed by a copper CMP process to remove the excess copper. Finally, a dielectric barrier layer 270, e.g., comprising silicon nitride (SiN) or silicon carbide (SiC), without limitation, may be formed over metal layer $M_{x+1}$.

As discussed above, in other embodiments a supplemental dielectric barrier layer may be deposited after etching the TFR element/diffusion barrier layer 220 (to define the TFR element 220a and interconnect diffusion barrier region 220b as discussed above) and left intact as a continuous layer extending across the wafer. FIGS. 13A-15 show an example process for forming a TFR module 1302 along with a nearby interconnect structure 1304 in an example IC structure 1300, wherein a supplemental dielectric barrier layer 230 is deposited after etching the TFR element/diffusion barrier layer 220 and left intact, according to one embodiment of the present disclosure.

Figure 13A:
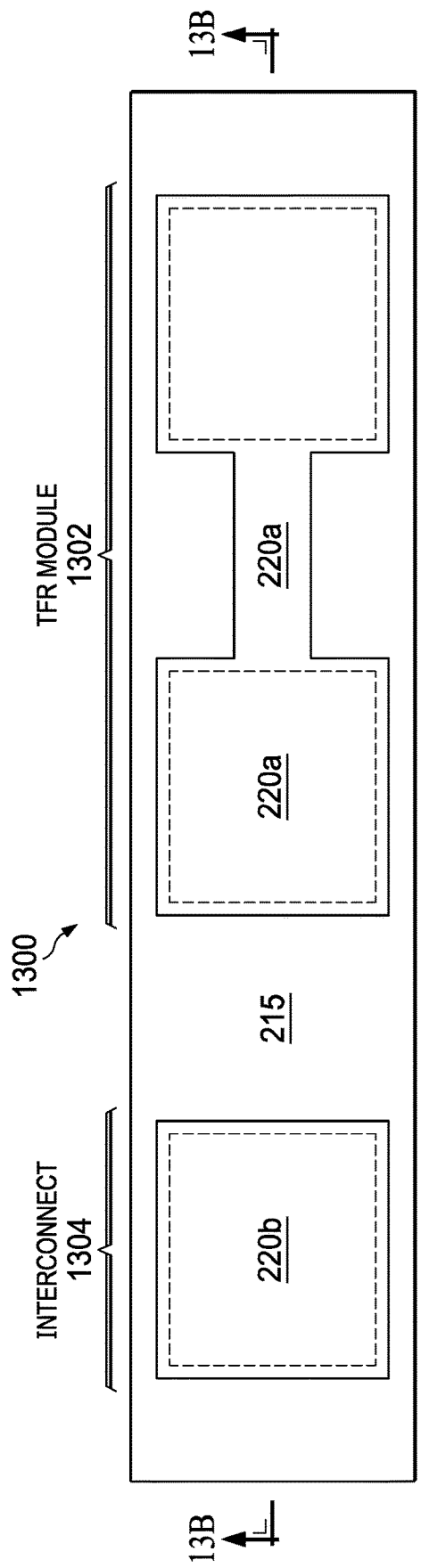
FIGS. 13A-15 show an example process for forming an integrated circuit structure including a TFR module with a TFR element that provides a diffusion barrier for underlying metal TFR heads, along with a supplemental dielectric barrier layer, according to another example embodiment.
Figure 13B:
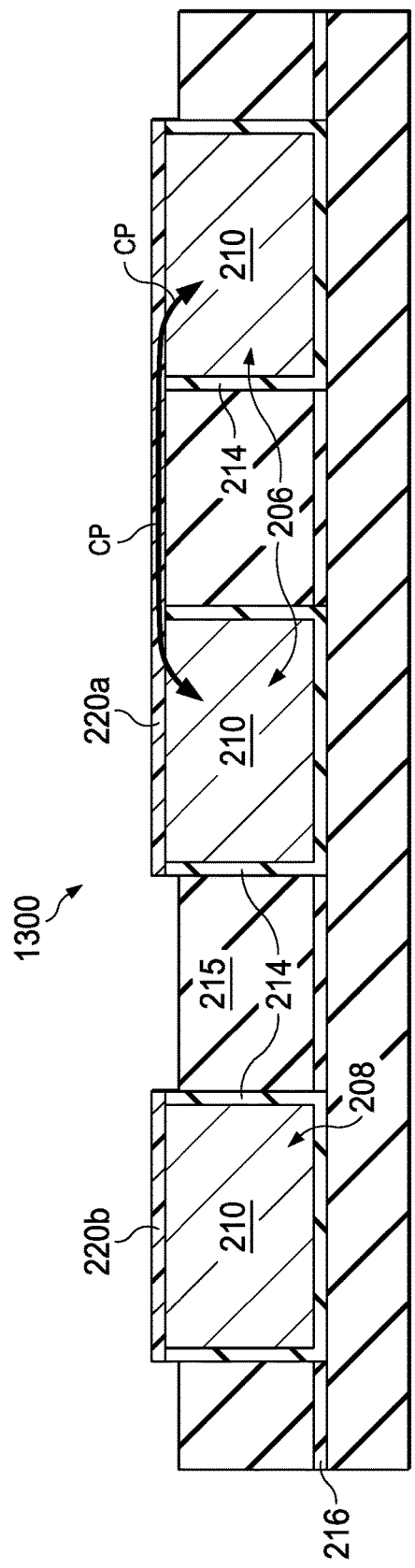

FIGS. 13A and 13B show the example IC structure 1300 after forming and etching a TFR element/diffusion barrier layer 220 to define (a) a TFR element 220a over a pair of TFR heads 206 and over a portion of dielectric region 215 therebetween, and (b) an interconnect diffusion barrier region 220b over a lower interconnect element 208. Thus, FIGS. 13A and 13B correspond with FIGS. 6A and 6B discussed above.

Figure 14A:
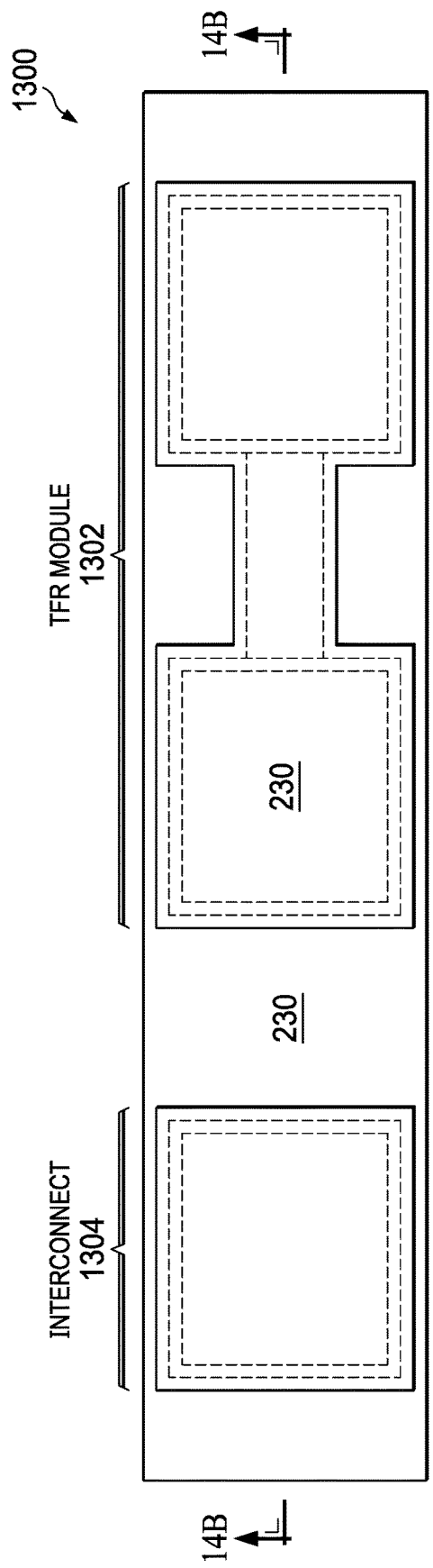
Figure 14B:
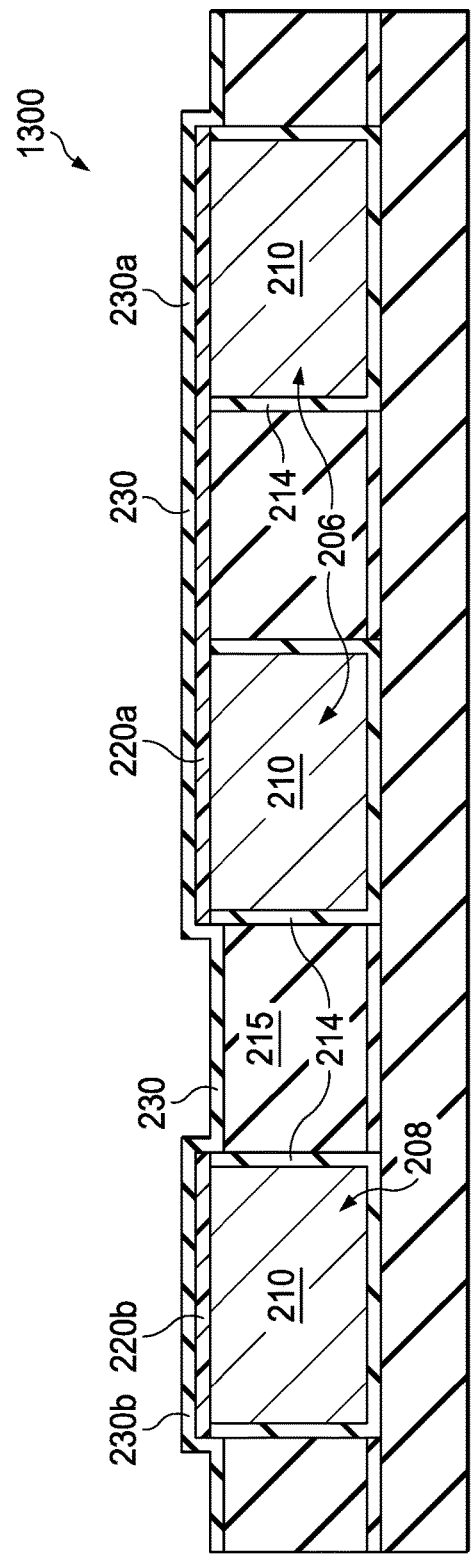
Figure 15:
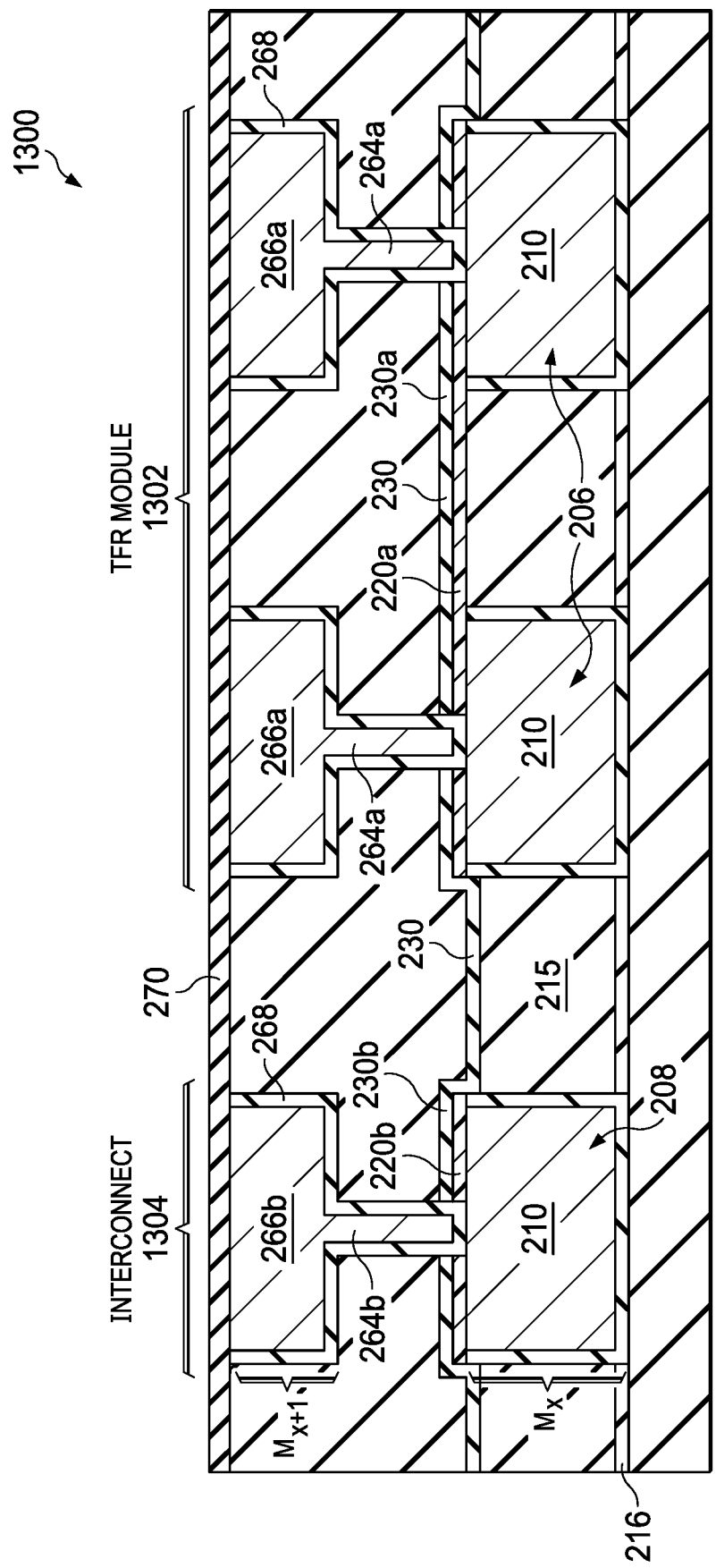

Next, as shown in FIGS. 14A and 14B, a supplemental dielectric barrier layer 230 is deposited on the waver, coving the TFR element 220a, interconnect diffusion barrier region 220b, and exposed portions of the dielectric region 215. The dielectric barrier layer 230 may comprise SiN or SiC, or other dielectric material that provides additional protection against metal diffusion from underlying metal elements 210. The dielectric barrier layer 230 may be deposited by Plasma Enhanced Chemical Vapor Deposition (PECVD), or other suitable technique. In some embodiments, the dielectric barrier layer 230 may have a thickness in the range of 250 Å-1000 Å, or about 500 Å. As shown, the dielectric barrier layer 230 includes a TFR dielectric cap region 230a coving the TFR element 220a and an interconnect dielectric cap region 230b coving the interconnect diffusion barrier region 220b.

Next, unlike the embodiment shown in FIGS. 8A-12 discussed above, in this embodiment the IC manufacturing process may continue with the dielectric barrier layer 230 left intact (e.g., not selectively etched over each metal element 210). For example, as shown in the side cross-sectional view of FIG. 15, interconnect formation may continue, to thereby contact the TFR heads 206 and lower interconnect element 208. Each TFR head 206 may be contacted by a respective interconnect via 264a connected to a respective metal structure 266a formed in a metal layer $M_{x+1}$, and lower interconnect element 208 may be contacted by an interconnect via 264b and upper interconnect element 266b formed in metal layer $M_{x+1}$. In the illustrated embodiment, TFR contacts 266a and TFR contact vias 264a, and upper interconnect element 266b and interconnect via 264b, comprise Cu dual damascene structures, e.g., formed by depositing a barrier layer 268 (e.g., a Ta/TaN bilayer), copper seed, and followed by copper plating, in a dual damascene trench, followed by a copper CMP process to remove the excess copper. Finally, a dielectric barrier layer 270, e.g., comprising silicon nitride (SiN) or silicon carbide (SiC), without limitation, may be formed over metal layer $M_{x+1}$.

The invention claimed is:

1. A method of forming a TFR module in an integrated circuit structure, the method comprising:
   forming a pair of metal TFR heads spaced apart from each other in the integrated circuit structure;
   depositing a TFR element/diffusion barrier layer directly on the pair of metal TFR heads;
   selectively etching the TFR element/diffusion barrier layer to define a TFR element covering a full top surface of each of the pair of metal TFR heads, the TFR element defining a conductive path between the pair of metal TFR heads through the TFR element, and the TFR element providing a barrier against metal diffusion from the metal TFR heads; and
   forming a respective TFR contact connected to each of the pair of metal TFR heads through a respective area of the TFR element.

2. The method of claim 1, wherein the TFR element/ diffusion barrier layer comprises TaN.

3. The method of claim 1, wherein the TFR element/ diffusion barrier layer comprises SiCr, SiCCr, $TiN_xO_y$, TiN, TiW, $TiW_2N$, or TiZrN.

4. The method of claim 1, wherein the TFR element:
   (a) has a sheet resistance in the range of 200 Ω/square to 2 Ω/square; and (b) has a temperature coefficient of resistance (TCR) in the range of −100 ppm/° C. to +100 ppm/° C.

5. The method of claim 1, wherein the pair of metal TFR heads are formed in a common metal interconnect layer.

6. The method of claim 1, wherein forming TFR contacts connected to each of the pair of metal TFR heads comprises:
forming vias respectively connected to the pair of metal TFR heads; and
forming TFR contacts in a metal layer above the metal TFR heads and connected to the metal TFR heads by the respective vias.

7. The method of claim 1, wherein the pair of metal TFR heads comprise copper TFR heads.

8. The method of claim 1, comprising forming the pair of metal TFR heads using a copper damascene process.

9. The method of claim 1,
comprising forming a dielectric barrier layer on the TFR element/diffusion barrier layer before etching the TFR element/diffusion barrier layer, such that the dielectric barrier layer is etched along with the TFR element/diffusion barrier layer.

10. The method of claim 1,
comprising forming a dielectric barrier layer on the TFR element/diffusion barrier layer after etching the TFR element/diffusion barrier layer.

11. A method of forming an integrated circuit structure, comprising:
forming a plurality of metal structures in a metal layer, the plurality of metal structures defining a pair of metal TFR heads and an interconnect element spaced apart from the pair of metal TFR heads;
depositing a TFR element/diffusion barrier layer on the plurality of metal structures, the TFR element/diffusion barrier layer comprising a material that provides a barrier against metal diffusion;
patterning the TFR element/diffusion barrier layer to define:
(a) a TFR element in contact with the pair of metal TFR heads, the TFR element defining a conductive path between the metal TFR heads through the TFR element; and
(b) an interconnect diffusion barrier region on the interconnect element, the interconnect diffusion barrier region spaced apart from the TFR element; and
forming TFR contacts connected to each of the pair of metal TFR heads.

12. The method of claim 11, wherein the TFR element/diffusion barrier layer comprises TaN.

13. The method of claim 11, wherein the TFR element/diffusion barrier layer comprises SiCr, SiCCr, $TiN_xO_y$, TiN, TiW, $TiW_2N$, or TiZrN.

14. The method of claim 11, wherein the TFR element:
(a) has a sheet resistance in the range of 200 Ω/square to 2 Ω/square; and
(b) has a temperature coefficient of resistance (TCR) in the range of −100 ppm/° C. to +100 ppm/° C.

15. The method of claim 11, wherein forming the plurality of metal structures in the metal layer comprises forming a plurality of copper trench elements in a copper interconnect layer.

16. The method of claim 11, wherein forming the plurality of metal structures in the metal layer comprises forming a plurality of copper damascene structures.

17. The method of claim 11, comprising forming a dielectric barrier layer on the TFR element/diffusion barrier layer before patterning the TFR element/diffusion barrier layer, such that the dielectric barrier layer is etched along with the TFR element/diffusion barrier layer.

18. The method of claim 11, comprising forming a dielectric barrier layer on the TFR element/diffusion barrier layer after patterning the TFR element/diffusion barrier layer.

* * * * *